United States Patent
Harney et al.

(10) Patent No.: US 9,173,015 B2
(45) Date of Patent: *Oct. 27, 2015

(54) MICROPHONE MODULE WITH SOUND PIPE

(71) Applicants: Kieran P. Harney, Andover, MA (US); Dipak Sengupta, Boxboro, MA (US); Brian Moss, Skehacreggaun (IE); Alain V. Guery, Andover, MA (US)

(72) Inventors: Kieran P. Harney, Andover, MA (US); Dipak Sengupta, Boxboro, MA (US); Brian Moss, Skehacreggaun (IE); Alain V. Guery, Andover, MA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/223,996

(22) Filed: Mar. 24, 2014

(65) Prior Publication Data
US 2014/0294221 A1 Oct. 2, 2014

Related U.S. Application Data

(62) Division of application No. 13/661,402, filed on Oct. 26, 2012, now Pat. No. 8,747,280.

(60) Provisional application No. 61/561,121, filed on Nov. 17, 2011.

(51) Int. Cl.
*H04R 25/00* (2006.01)
*H04R 1/08* (2006.01)
*H04R 1/34* (2006.01)
*H04R 19/00* (2006.01)
*H04R 19/04* (2006.01)

(52) U.S. Cl.
CPC .............. *H04R 1/08* (2013.01); *H04R 1/342* (2013.01); *H04R 19/005* (2013.01); *H04R 19/04* (2013.01); *H04R 2499/11* (2013.01)

(58) Field of Classification Search
CPC ........ H04R 1/08; H04R 1/342; H04R 19/005; H04R 19/04; H04R 2499/11
See application file for complete search history.

(56) References Cited

U.S. PATENT DOCUMENTS

2007/0026905 A1* 2/2007 Murray ................. 455/570
2010/0295139 A1* 11/2010 Ly et al. ................ 257/416
2011/0158450 A1* 6/2011 Tanaka et al. ......... 381/355

* cited by examiner

*Primary Examiner* — Tuan D Nguyen
(74) *Attorney, Agent, or Firm* — Maryam Imam; IPxLaw Group LLP

(57) ABSTRACT

A microphone module has a substrate with an aperture to allow sound waves to pass through the substrate, a lid mounted to the substrate to define a first interior volume, a microphone mounted to the substrate within the first interior volume, and a housing coupled to the substrate and covering the aperture. The housing forms a second interior volume and includes an acoustic port configured to allow sound to enter the second interior volume. The module further includes a pipe extending from the acoustic port in the housing, and at least one exterior interface pad outside of the second interior volume. The pipe has an open end to receive sound waves and direct them toward the acoustic port in the housing. Moreover, the at least one exterior interface pad electrically couples to the microphone.

17 Claims, 28 Drawing Sheets

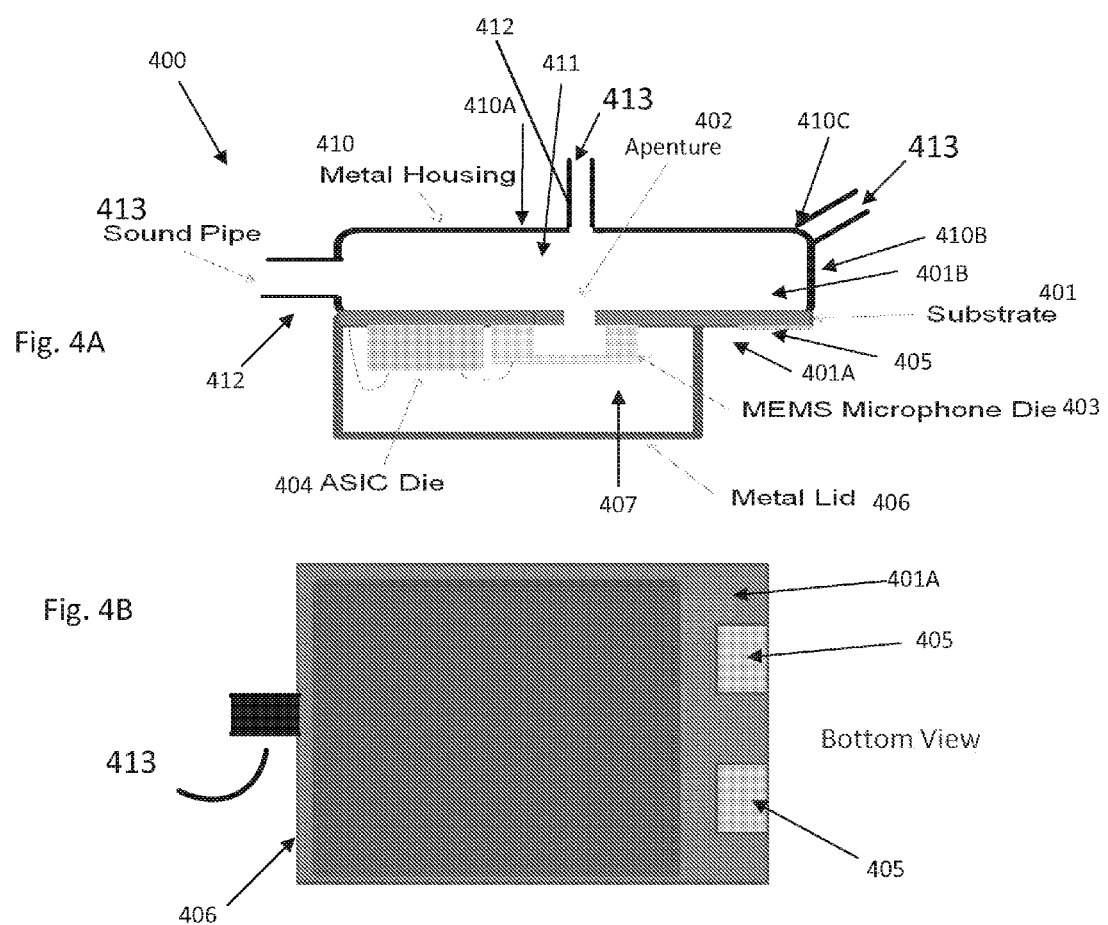

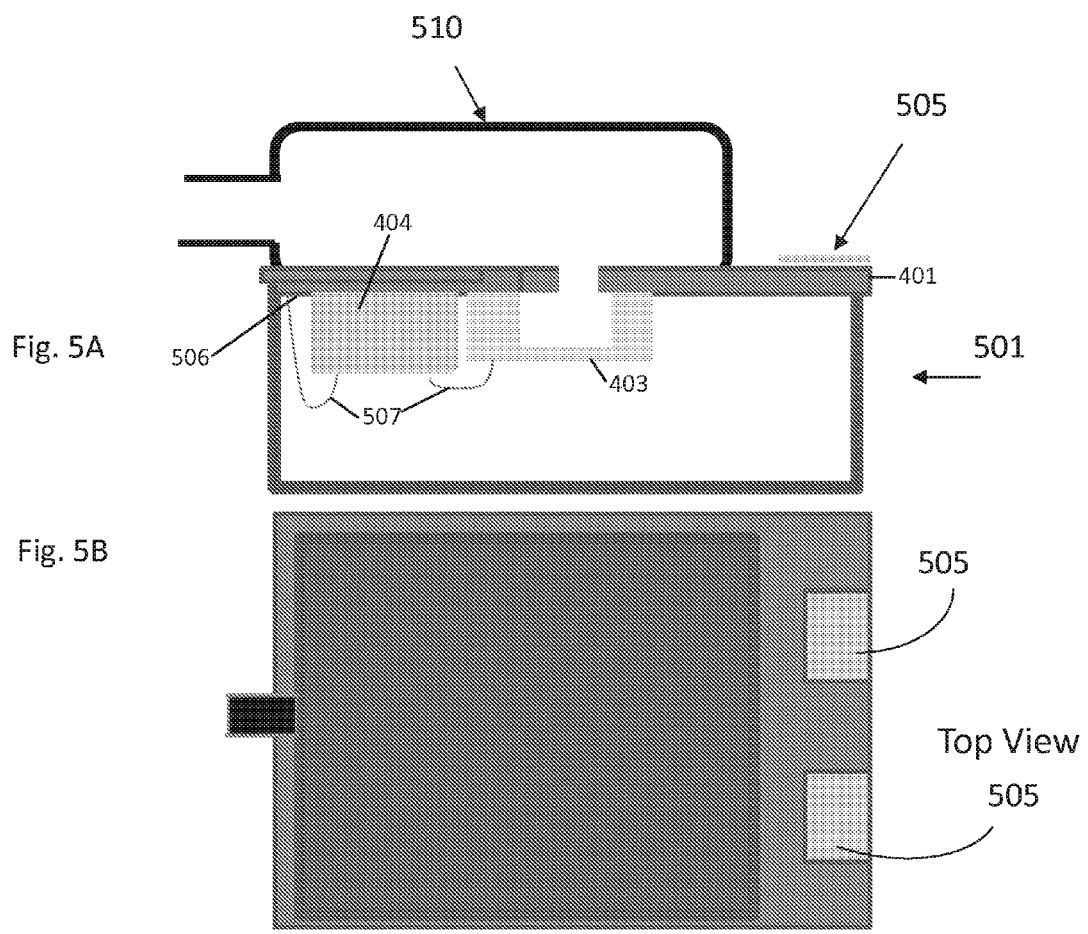

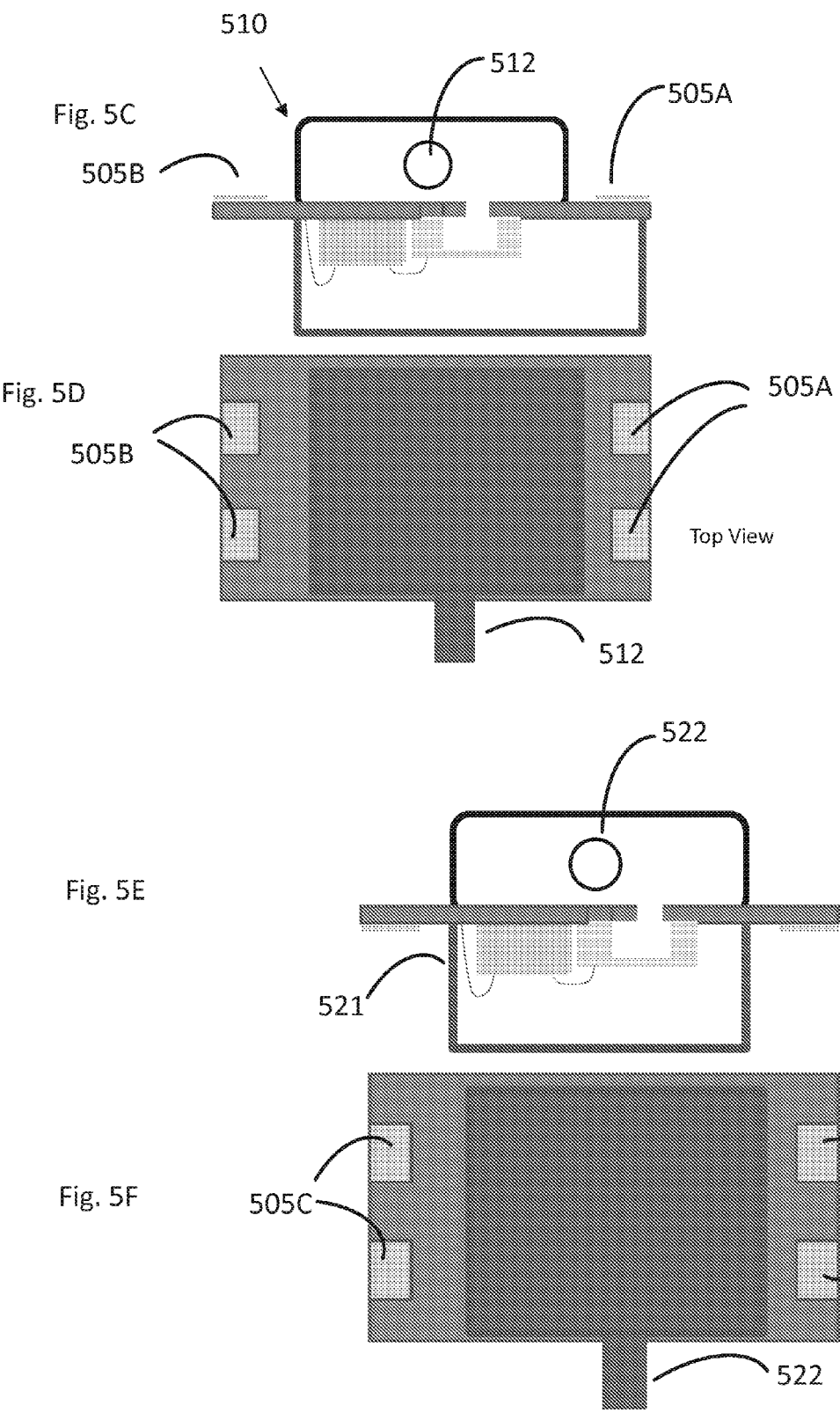

Fig. 6B    Bottom View

Fig. 6D    Bottom View

Fig. 7B  Top View

Fig. 7D  Top View

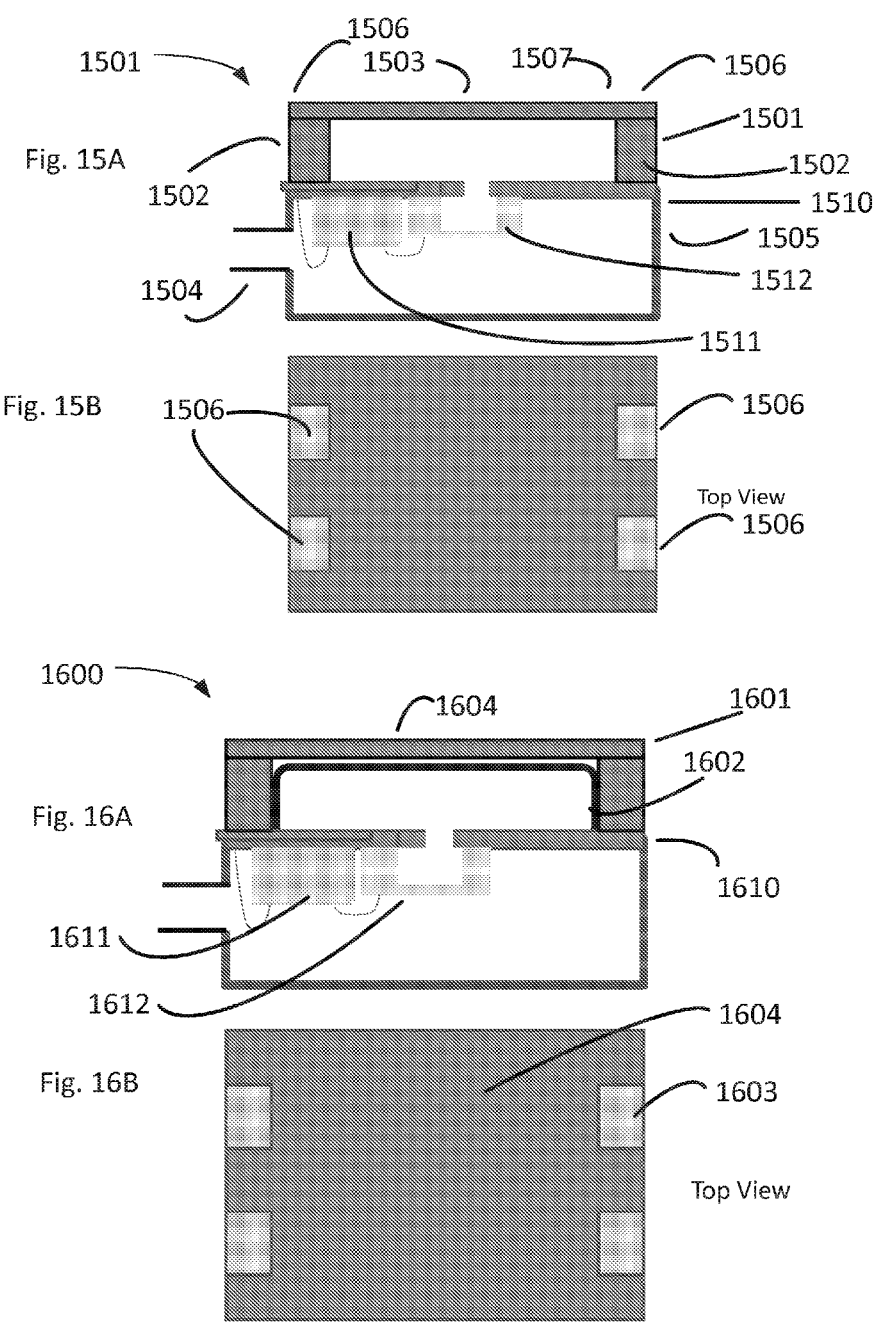

Bottom View

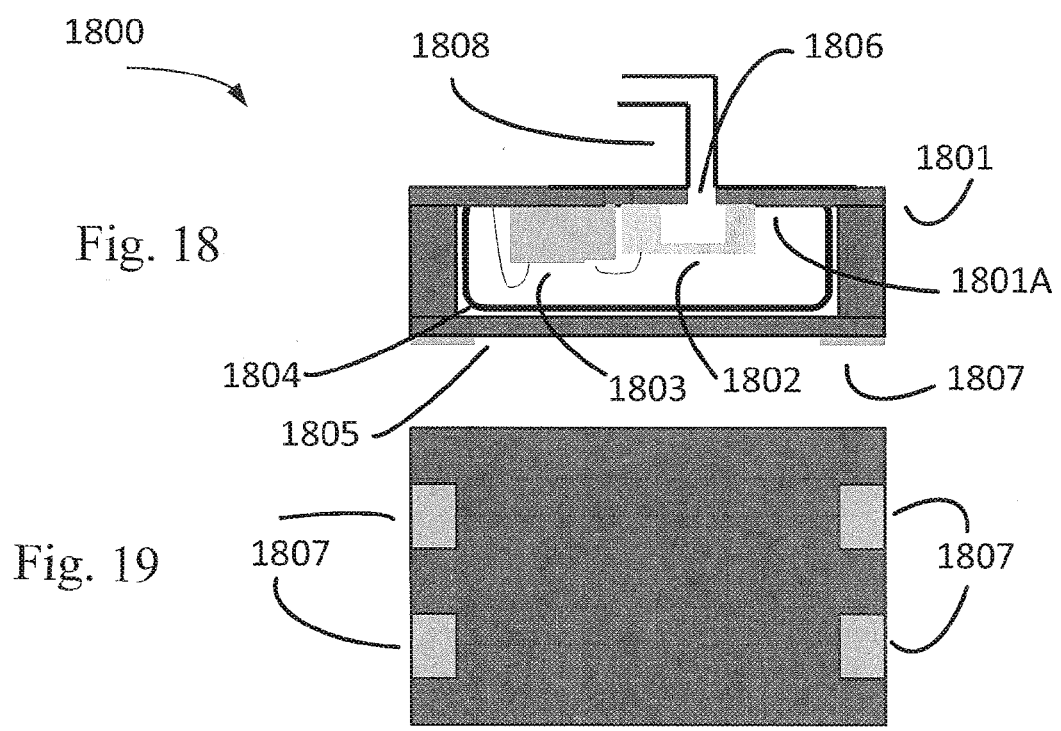

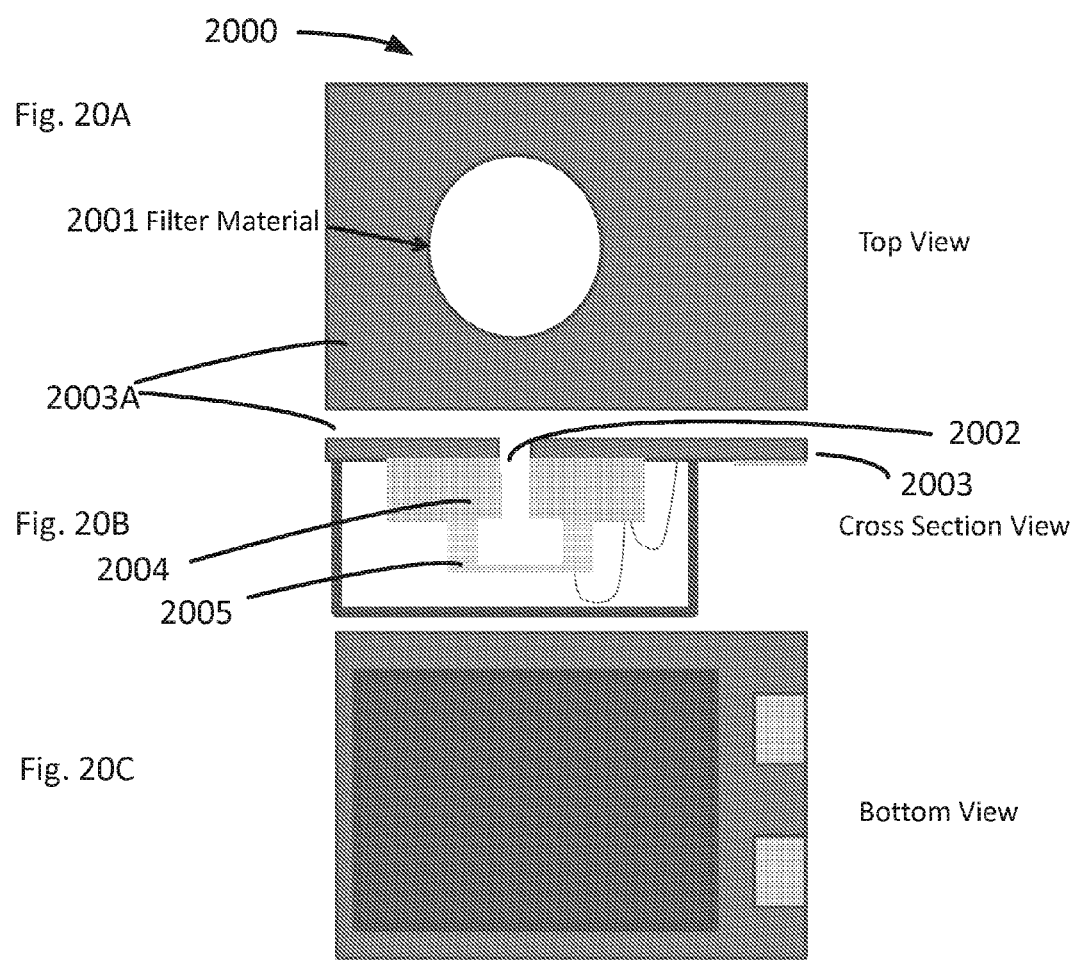

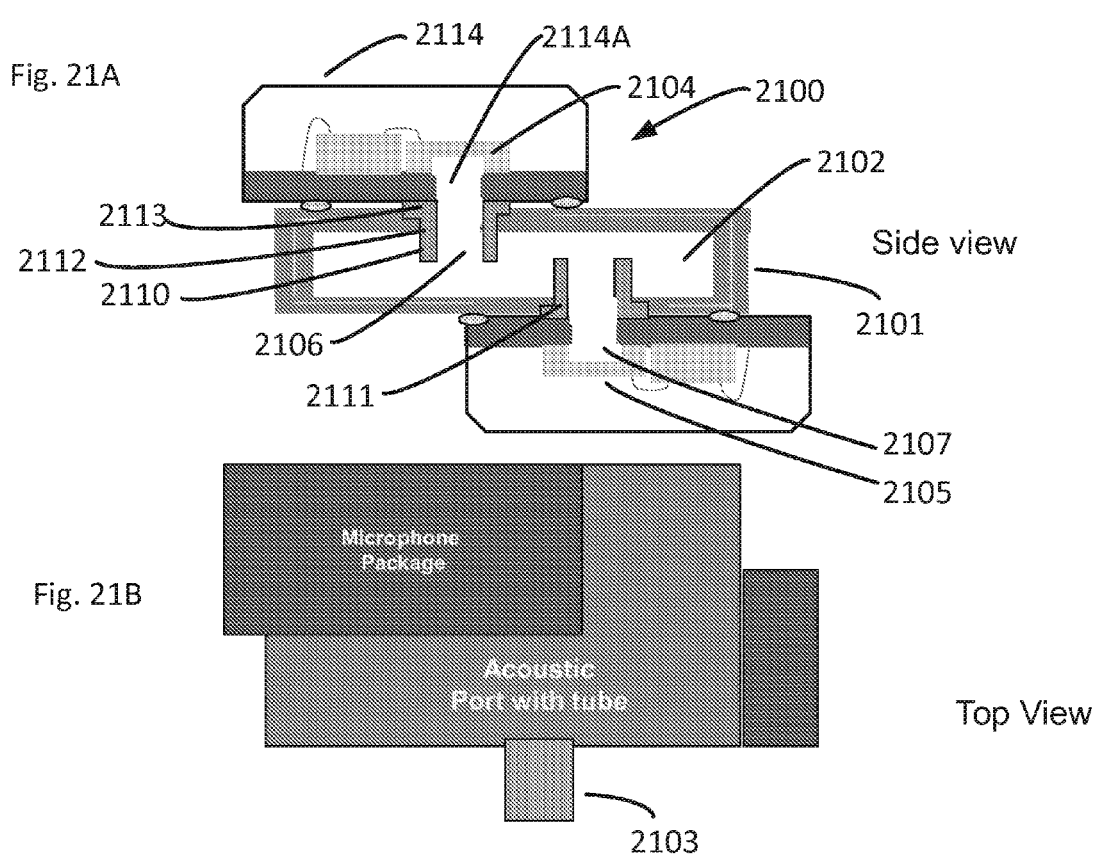

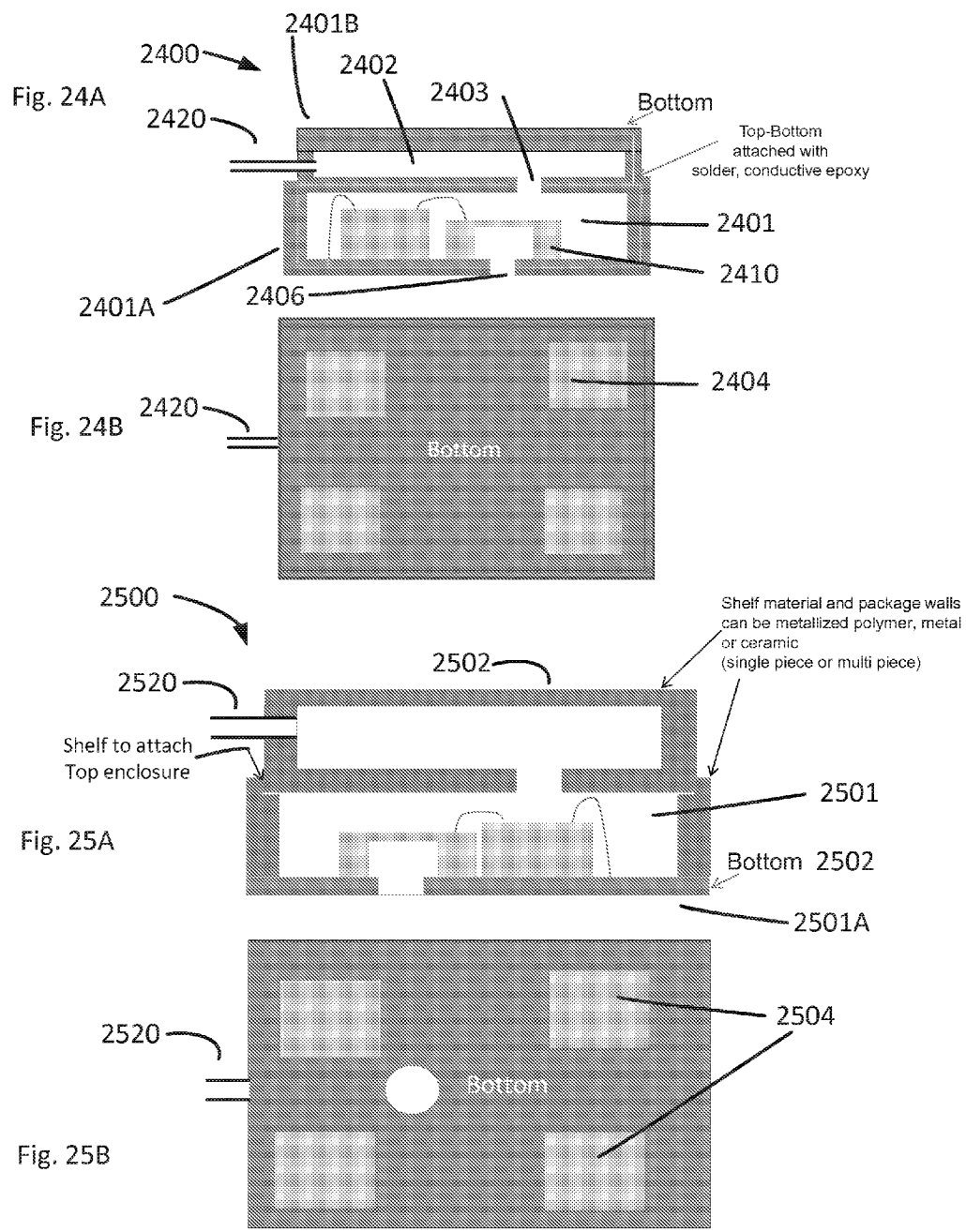

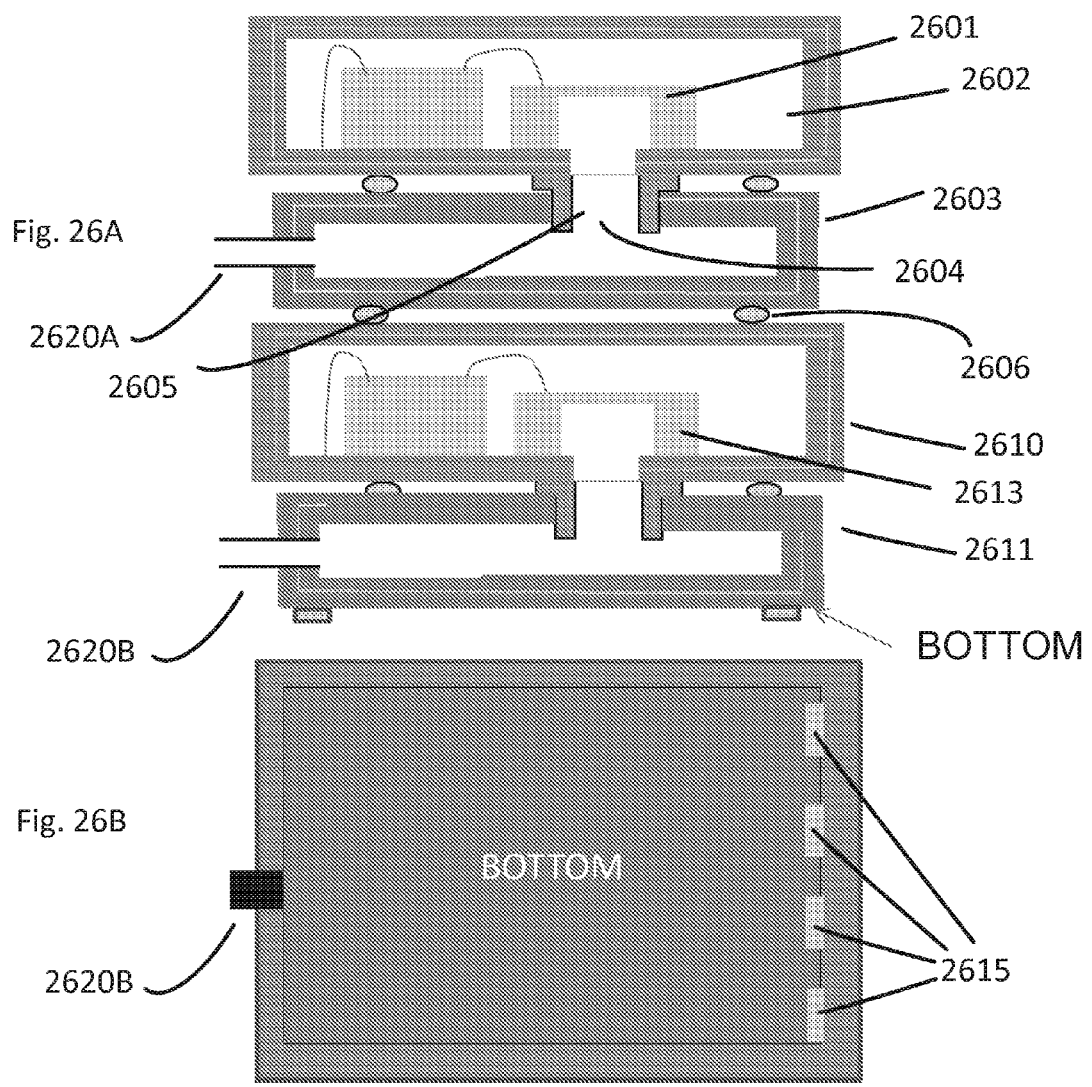

MICROPHONE MODULE WITH SOUND PIPE

PRIORITY

This patent application is a divisional application of U.S. patent application Ser. No. 13/661,402, filed on Oct. 26, 2012, and naming Kieran P Harney, Dipak Sengupta, Brian Moss, and Alain Guery as inventors, and entitled "MICROPHONE MODULE WITH SOUND PIPE" claims priority from provisional U.S. patent application No. 61/561,121, filed Nov. 17, 2011, entitled, "MICROPHONE MODULE," and naming Kieran P Harney, Dipak Sengupta, Brian Moss, and Alain Guery as inventors, the disclosure of which is incorporated herein, in its entirety, by reference.

FIELD OF THE INVENTION

The invention generally relates to microphones and, more particularly, the invention relates to a structure for housing microphones.

BACKGROUND OF THE INVENTION

Small microphone systems have a broad range of applications, including use in hearing aids, Bluetooth headsets, and mobile phones. Typical microphone systems include a microphone element, such as a microelectromechanical system microphone (also known as a "micromachined microphone," "silicon microphone," or "MEMS microphone"). The microphone may include on-board circuitry to process the microphone element's electrical output signals, or may be packaged with another circuit in the same package.

Many microphone packages have a base and a lid, and are configured to be mounted onto a larger substrate, such as a printed circuit board or other surface of a larger system. For example, a packaged microphone may be mounted to an interior surface of a host system, such as cellular phone. Placement of the microphone system/packaged microphone within the host system is important, however, to ensure that acoustic signals can reach their internal microphone element. If spaced too far from a host port that receives those signals (e.g., the mouthpiece of a mobile telephone), the microphone element may not adequately receive and convert the input acoustic signal.

SUMMARY OF VARIOUS EMBODIMENTS

In accordance with one embodiment of the invention, a microphone module has a substrate with a first side and a second side opposite the first side. The substrate has an aperture extending from the first side to the second side to allow sound waves to pass through the substrate. The module also includes a lid mounted to the first side to define a first interior volume, a microphone mounted to the first side and within the first interior volume, and a housing coupled to the second side and covering the aperture. The housing and second side form a second interior volume, while the housing includes an acoustic port configured to allow sound to enter the second interior volume. The module further has a pipe extending from the acoustic port in the housing, and at least one exterior interface pad on the second side and outside of the second interior volume. The pipe has an open end to receive sound waves and direct them toward the acoustic port in the housing. In addition, the at least one exterior interface pad is electrically coupled to the microphone.

The housing may have a top and at least one sidewall. The acoustic port thus may be disposed through the top of the housing, and the pipe may extend from the top of the housing. Alternatively, or in addition, the acoustic port may be disposed through the sidewall of the housing, and the pipe may extend from the at least one sidewall of the housing. The housing also may include a second acoustic port with a second pipe extending therefrom. Among other shapes, the pipe may be straight.

The microphone may include a MEMS microphone, and the module further may include a circuit chip coupled with the first side of the substrate. Moreover, the lid may include conductive material that is electrically connected with the substrate. For example, the substrate may have a metalized portion, and the lid may be formed from metal and be electrically connected to the metalized portion of the substrate to protect against electromagnetic interference.

The housing may take on any of a variety of different configurations. For example, the housing may include a flanged sound pipe where the pipe has a pipe volume that forms most of the second interior volume. In this case, the flanged pipe may be mounted substantially flush against the second side of the substrate. Moreover, the housing, which may cover no more than a portion of the second side, may be formed at least in part from a conductive material.

In some embodiments, the microphone covers the aperture in the substrate. In addition or alternatively, at least one exterior interface pad preferably is surface mountable. The internal components may electrically connect with the exterior interface pad in a number of different manners. For example, the module may have an interior interface pad within the first interior volume, a circuit chip within the interior volume, and first and second wire bonds within the interior volume. The first wire bond may electrically connect the microphone to the circuit chip, while the second wire bond may electrically connect the circuit chip to the interior interface pad. The microphone thus can electrically connect with the exterior interface pad on the second side through the first wire bond, circuit chip, second wire bond, and interior interface pad.

In accordance with another embodiment of the invention, a microphone module has a substrate with a first side, and a second side opposite the first side. The substrate, which has a metalized portion, also has an aperture extending from the first side to the second side to allow sound waves to pass through the substrate. The module further includes a lid mounted to the first side, a MEMS microphone mounted to the first side and within the first interior volume, and a circuit chip coupled with the first side of the substrate and electrically connected with the microphone. The first side and lid are considered to define a first interior volume, and the lid is formed from a conductive material. The lid is electrically connected to the metalized portion of the substrate to protect against electromagnetic interference. Also, in a manner similar to the MEMS microphone, the circuit chip also is mounted within the first interior volume. The module further has a housing coupled to the second side and covering the aperture. The housing and second side form a second interior volume, and the housing also has an acoustic port configured to allow sound to enter the second interior volume. The housing covers no more than a portion of the second side of the substrate. A pipe extends from the acoustic port in the housing. This pipe has an open end to receive sound waves and direct them toward the acoustic port in the housing. In addition, the module also has at least one exterior, surface mountable interface pad on the second side and outside of the second interior volume. The at least one exterior interface pad electrically couples to the microphone.

In accordance with other embodiments of the invention, a microphone module has a substrate with an aperture to allow sound waves to pass through the substrate, a lid mounted to the substrate to define a first interior volume, a microphone mounted to the substrate within the first interior volume, and a housing coupled to the substrate and covering the aperture. The housing forms a second interior volume and includes an acoustic port configured to allow sound to enter the second interior volume. The module further includes a pipe extending from the acoustic port in the housing, and at least one exterior interface pad outside of the second interior volume. The pipe has an open end to receive sound waves and direct them toward the acoustic port in the housing. Moreover, the at least one exterior interface pad electrically couples to the microphone.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIGS. 4A and 4B schematically illustrate an embodiment of a microphone module;

FIG. 5A-5H schematically illustrate various microphone module embodiments;

FIGS. 6A-6D schematically illustrate various microphone module embodiments;

FIGS. 7A-7D schematically illustrate various microphone module embodiments;

FIGS. 15A and 15B schematically illustrate an embodiment of a microphone module;

FIGS. 16A and 16B schematically illustrate an embodiment of a microphone module;

FIGS. 18 and 19 schematically illustrate an embodiment of a microphone module;

FIGS. 20A-20C schematically illustrate an embodiment of a microphone module;

FIGS. 21A and 21B schematically illustrate an embodiment of a microphone module;

FIGS. 24A and 24B schematically illustrate an embodiment of a microphone module;

FIGS. 25A and 25B schematically illustrate an embodiment of a microphone module;

FIGS. 26A and 26B schematically illustrate an embodiment of a microphone module;

DESCRIPTION OF ILLUSTRATIVE EMBODIMENTS

Various microphone module embodiments may be mounted into a host system in a variety of ways, consequently providing to a system designer flexibility and options not available with prior art microphone packages. To that end, in various embodiments, the microphone module has at least one acoustic port that is acoustically coupled to a microphone element within its interior. In some embodiments, the acoustic port includes a structure that is configured to couple to a sound pipe (or acoustic waveguide) which may be used as-is, or which may be extended by attaching an additional length of sound pipe. The sound pipe guides incoming sound to the acoustic port. As such, the microphone module may be mounted within a larger system without requiring that its aperture be immediately adjacent to the sound source, or directly adjacent to a structure with an aligned counterpart aperture. In fact, unlike various prior art microphone packages known to the inventors, some embodiments may not need to be mounted to an underlying substrate.

Figure 1A:
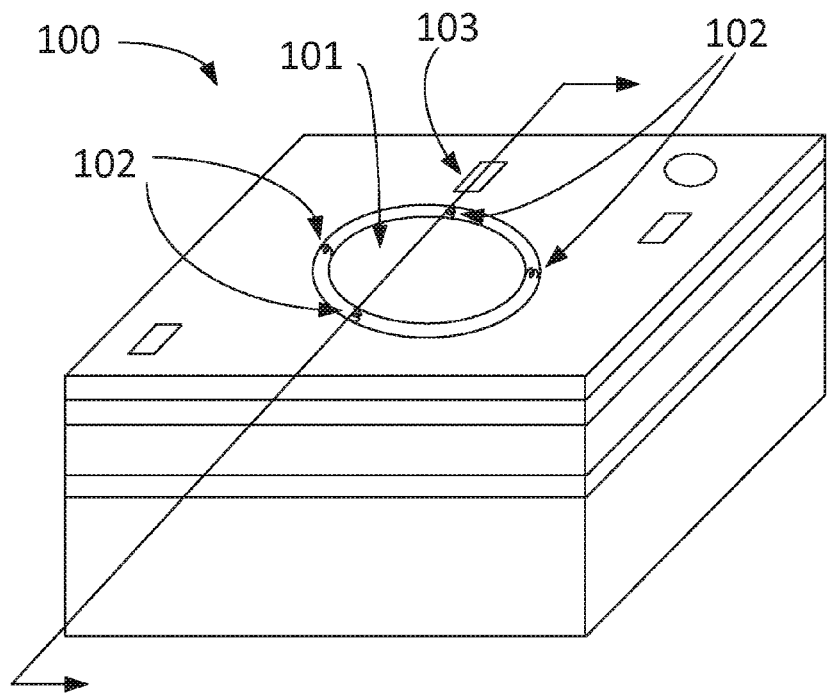
FIGS. 1A and 1B schematically illustrate a prior art MEMS microphone.
Figure 1B:
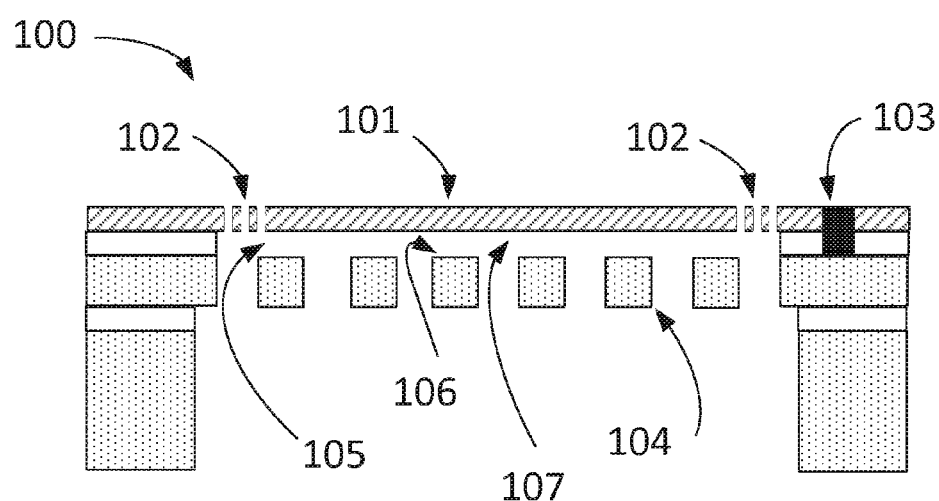

A microphone (or "microphone element") is a transducer that produces electrical signals in response to impinging sound waves. The operation of the microphone depends on the ability of sound waves to reach the microphone, and particularly the microphone's diaphragm, from the source of the sound. One type of microphone is a microelectromechanical system (or "MEMS") microphone 100 (a/k/a "micromachined"), is schematically illustrated in perspective view in FIG. 1A, while FIG. 1B schematically illustrates a cross-section of the same microphone 100. Microphone 100 includes a diaphragm 101 suspended by springs 102 above a backplate 104. The diaphragm 101 and backplate 104 are both conductive, and are electrically isolated from each other. As such, the diaphragm 101 and backplate 104 form a capacitor. It should be noted, however, that MEMS microphones can be configured in many different ways, and FIG. 1 is simply one particular way.

More specifically in the microphone 100, the diaphragm 101 and backplate 104 form a variable capacitor. In operation, the diaphragm 101 vibrates in response to incident sound waves, thus changing the gap 105 between the diaphragm 101 and backplate 105. Among other things, this means that, as the gap 105 narrows, the diaphragm 101 approaches the backplate 104. The capacitance of the variable capacitor formed by the diaphragm 101 and backplate 104 therefore varies with the impinging sound waves. The variable capacitance can be electronically processed to produce an electrical signal representing the impinging sound waves, in ways well known in the art.

Figure 2:
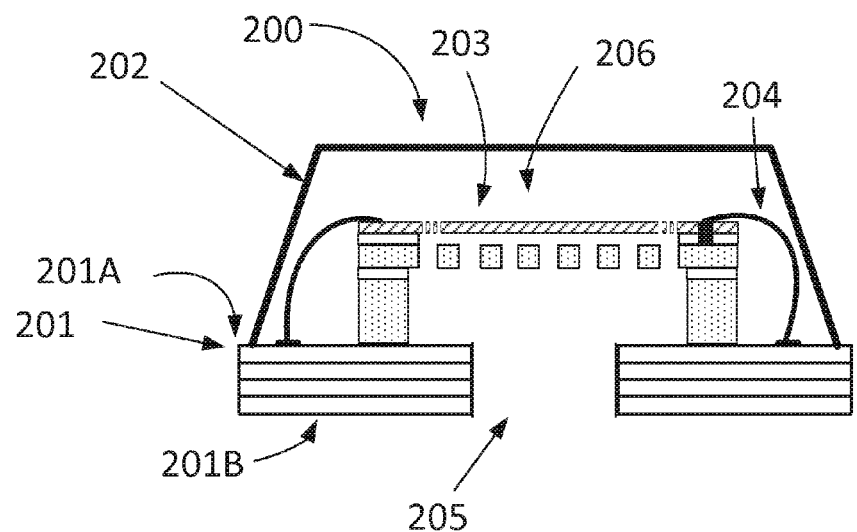
FIG. 2 schematically illustrates a prior art packaged microphone.

Prior art packages known to the inventors typically enclose the microphone element (e.g., microphone 100) in a package having a substrate and a lid, as schematically illustrated in FIG. 2. In that figure, a packaged microphone 200 has a microphone 203 mounted to a surface 201A of laminate substrate 201. The lid 202 and the surface 201A of the substrate 201 define an interior volume surrounding the microphone 203. The microphone 203 is physically coupled to the substrate 201, and also electrically coupled to the substrate 201 by one or more wirebonds 204.

The substrate 201 includes an aperture 205 that permits sound waves into the interior volume containing the microphone 203. Some embodiments may alternately, or in addition, have an aperture in the lid.

Figure 3:
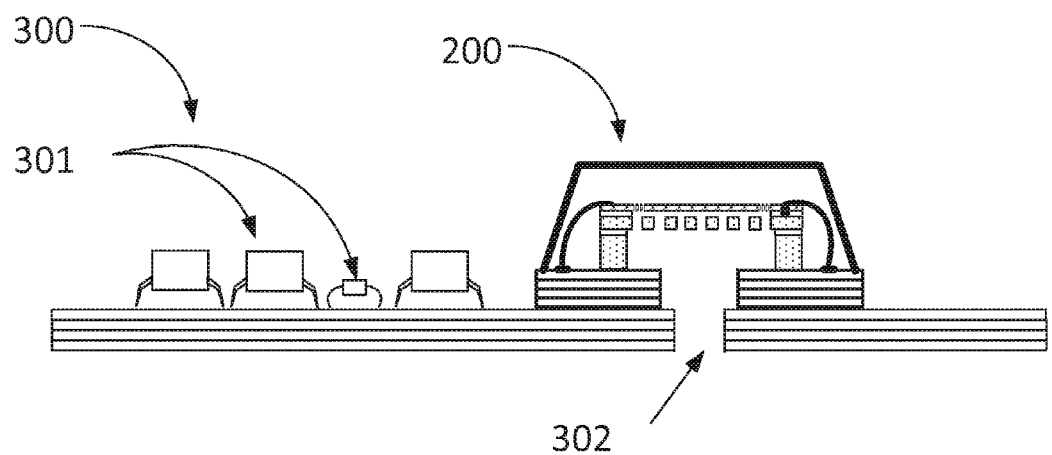
FIG. 3 schematically illustrates a prior art packaged microphone mounted on a circuit board along with other components.

The packaged microphone 200 may be mounted to printed circuit board 300, which often also includes other circuit elements 201, as schematically illustrated in FIG. 3. Alternatively, the packaged microphone 200 may be mounted to another surface within a system that hosts the microphone system 200. Incoming sound waves reach the microphone 203 by passing through an aperture 302 in the printed circuit board, and then through the aperture 205 in the substrate 201. As shown by FIG. 3, this particular example of a prior art packaging system 200 limits the system designer's freedom of choice because the packaged system 200 must be mounted adjacent to (and in fact covering) the aperture 302 in the printed circuit board.

In contrast, FIG. 4A schematically shows one embodiment of a microphone module 400 that provides a wider range of options for use in a host system. In particular, the microphone module 400 includes an acoustic port 412 to guide sound waves from a distal location to an interior volume of the system 400. To that end, the microphone module 400 includes a substrate 401 supporting a microphone 403, a lid 406 covering the microphone 403, and a housing 410. In this embodiment, the housing 410 includes two acoustic ports 412 configured to acoustically couple the entire microphone module 400 to a source of incoming sound.

While some embodiments of an acoustic port include a short section of sound pipe 413, which may be configured to attach to another section of sound pipe 413, in other embodiments the acoustic port 412 is an aperture. The sound pipe typically has an open end to receive and acoustic signal, and an end attached to the acoustic port 412 in the housing 410. The dimensions of the sound pipe may be defined, at least in part, by the mechanical and acoustic characteristics of the host system with which the microphone system will be used. Among other things, the length and diameter of the sound pipe can define acoustic performance, such as resonances that may in some cases be desirable. As just one example, in some embodiments, the sound pipe may have a circular cross-section with a diameter of 0.5 millimeters, and be five millimeters in length. The sound pipe may be straight, or may include one or more curves, angles or bends.

Specifically, the module 400 has a substrate 401 having a first side 401A and a second side 401B. The substrate 401 may be a laminate (e.g., BT), or other material (e.g., FR-4, a pre-molded leadframe package base, or a ceramic carrier), and may include conductive elements to provide ground, power, and/or other electrical interconnection for other components of the microphone module 400. As another example, the substrate 401 acts as part of a Faraday Cage to provide electromagnetically shield its internally mounted microphone 403.

The substrate 401 includes at least one aperture 402 extending between the first side 401A and second side 401B. The microphone 403 and an circuit chip/ASIC 404 are mounted to the first side, and the microphone 403 preferably straddles/covers the aperture 402. Some embodiments, however, do not require the microphone 403 to cover the aperture 402. For example, the microphone 403 may be adjacent to but not cover the aperture 402.

The ASIC 404 is electrically coupled to the microphone 403 and processes the output of the microphone 403. The output of the ASIC, in turn, is coupled to one or more exterior interface pads 405 on the first side 401A. The interface pads 405 may be coupled to a host system of which the microphone module 400 is a part. The host system may communicate with the ASIC 404 and/or the microphone 403 via the interface pads 405. Another view of the interface pads 405 on the first surface 401A is schematically illustrated in FIG. 4B.

A lid 406 is mounted to the first surface 401 and covers the microphone 403, ASIC 404, and aperture 402. Thus, the substrate 401 and lid 406 form a first interior volume 407, which forms the majority of the back-volume for the microphone. The lid 406 may be formed from a variety of materials, and may be a conductor or an insulator. For example, the lid may be a conductive metal lid (e.g., a solid metal lid), a plastic lid, a laminate, or a non-metal lid with conductive plating.

In some embodiments, some or all of the first surface 401A of the substrate 401 may be metallized so that the lid may be coupled to the metallized portion. This may serve to keep the lid 406 grounded, and may serve to protect the microphone 403 or ASIC 404 against external electromagnetic interference ("EMI"). To that end, a solder or adhesive (e.g., a conductive epoxy) may secure the lid 406 to some part of the metalized portion of the substrate 401.

In the embodiment of FIG. 4A, the lid 406 does not cover the entire first surface 401A, and the interface pads 405 are outside of the lid 406. In other words, the interface pads 405 are outside of the first volume 407. This leaves the interface pads 405 available for connecting to a host system, for example by wire bonds, soldered leads, surface mounting to a printed circuit board ("PCB"), ACF attach (i.e., attachment using an "Anisotropic Conductive Film"), epoxy attach or other electrical connection means known in the art. Accordingly, among other things, the pads 405 are considered to be solderable.

The other side 401B of the substrate 401 includes a housing 410, which covers the aperture 402. The housing may include a variety of material, and may be a conductor or an insulator. For example, the housing may be a solid conductive metal structure, a plastic structure, or a non-metal structure with conductive plating. The housing 410 may be of the same material as the lid 406, although that is not required.

In some embodiments, some or all of the second surface 401B of the substrate 401 may be metallized, so that the housing may be coupled to the metallized portion. This may keep the housing 410 grounded, and may protect the microphone 403 or ASIC 404 against external electromagnetic interference. The housing 410 may be coupled to a metalized portion of the substrate 401 by solder or an adhesive, such as a conductive epoxy.

The housing 410 may cover the more of, or less than, the substrate's surface area than the lid 406. In some embodiments, however, the housing 410 covers about the same surface area as that of the lid 406. The substrate 401 and housing 410 form a second interior volume 411 through which sound can traverse.

The housing 410 may be considered as having a top 410A (e.g., the housing surface that is generally parallel with the substrate 401) and a plurality of sidewalls 410B (e.g., the housing surface that is generally orthogonal to the substrate 401). The top 410A and sidewalls 410B meet at corners 410C. Of course, other embodiments may have housings with a variety of shapes, including rectangular, oval, round, or irregular, and may include shapes with or without edges and/or corners. An acoustic aperture 412 on a sidewall 410B is acoustically coupled to the second volume 411, and may be coupled to a sound pipe 413. The sound pipe 413 guides sound waves from outside of the module 400 toward and into the second volume 411. The sound waves then pass through aperture 402 and impinge on the diaphragm 101 of microphone 403. In some embodiments, an acoustic port 413 may be on the top wall 410A of the housing 410, on a sidewall 410B of the housing, or at a corner 410C of the housing. The acoustic port 413 shown in FIG. 4A as extending from the acoustic aperture 412 on the top wall 410A may be used in addition to the sound pipe 413 extending from the side wall 410B, or as an alternative to the sound pipe 413 extending from the side wall 410B. In other words, the sound pipe 413 extending from the top wall 410A may be the only sound pipe 413 extending from the housing 410.

Figure 14:
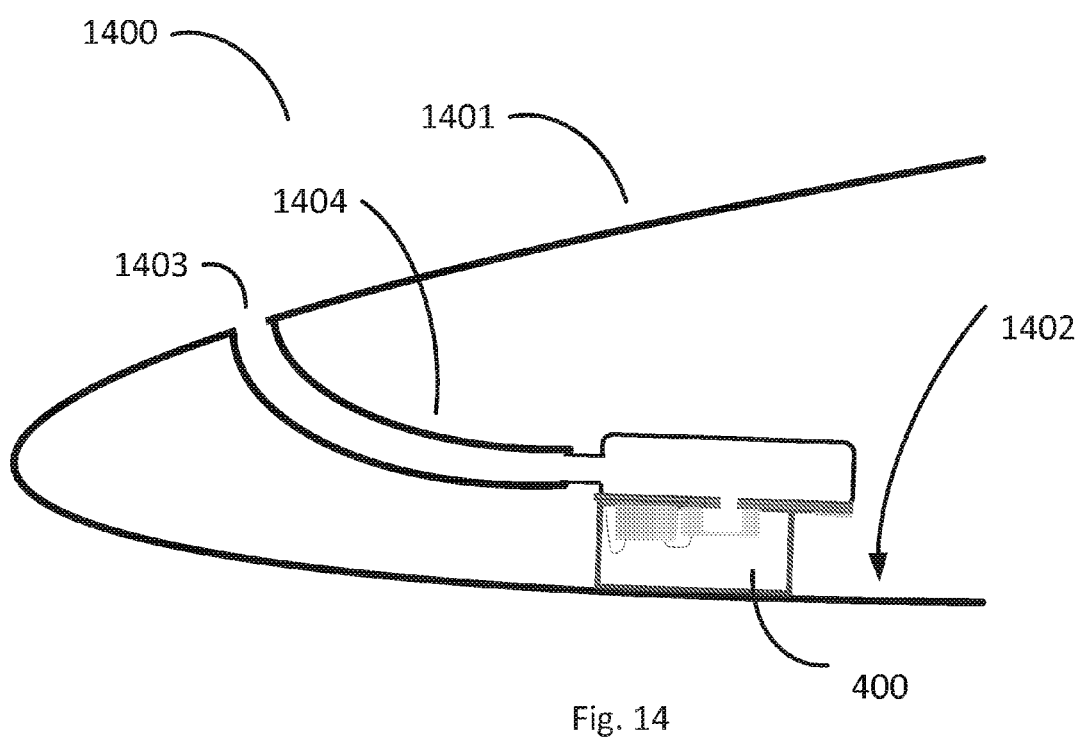
FIG. 14 schematically illustrates an embodiment of a microphone module within a host system.

In this way, the microphone module 400 may be mounted in a host system in a location that does not need to be immediately adjacent to an aperture or the source of the sound, and does not need to be mounted to a particular surface. Rather, the microphone module 400 may be mounted in any desired position within the host system, and the sound pipe can extend from the acoustic aperture 412 to the source of the sound and conduct the sound to the module 400. For example, as shown in FIG. 14, a microphone module 400 may be mounted at a location 1402 within a cellular telephone 1401. Alternately, the underlying system/host system could be other objects, such as a hearing aid, or a Bluetooth headset, to name but a few. A sound pipe 1403, which in this embodiment is a tube, directs incoming sound from the mouthpiece 1403 of the cellular phone 1401 to the microphone module 400. The sound pipe and other aspects of the microphone system design may be selected and optimized by the designer of the microphone system, or a host system, to provide the desired acoustic performance. Alternatively, rather than using a sound pipe, the system 1400 may have an aperture to allow sound to enter the microphone.

An alternate embodiment of a microphone module 500 is schematically illustrated in FIGS. 5A and 5B. In this embodiment, interface pads 505 are positioned on the same side of the substrate 501 as the housing 510, and yet are not within the housing 510. As noted above, this and other embodiments may connect the interface pads 505 to an underlying system, for example by wire bonds, soldered leads, surface mounting to a printed circuit board ("PCB"), ACF attach (i.e., attachment using an "Anisotropic Conductive Film"), epoxy attach or other electrical connection means known in the art.

FIG. 5A also shows how the microphone 403 and circuit chip 404 connect with the interface pads 505. Specifically, a first wire bond 507 connects the microphone 403 to the circuit chip 404, while a second wire bond 507 connects the circuit chip 404 to an internal interconnection pad 506. The interior interconnection pad 506 in turn is electrically connected with the external interface pad 505 through the substrate 401, thus electrically communicating the interior components (e.g., the microphone 403 and circuit chip 404) with an underlying system (e.g., the printed circuit board of a mobile telephone or hearing instrument).

Yet other embodiments are schematically illustrated in FIGS. 5C-5H. These and other embodiments can have features that can be combined. The embodiment in FIGS. 5C and 5D includes two arrays of interface pads, 505A and 505B, on the substrate 510 on either side of housing 511. In this illustration, the sound pipe 512 extends from the housing 510 in a direction normal to the page, and along a line that passes between the interface pad arrays 505A and 505B. Another embodiment, schematically illustrated in FIGS. 5E and 5F, has arrays of interface pads 505C and 505D on the same side of the substrate 520 as the lid 521, microphone 403 and ASIC 507, and on opposite sides of the lid 521. Other embodiments may have one or more interface pads 505, or arrays of interface pads 505, with some on one side of the substrate, and some on the other side of the substrate.

Figure 5G:
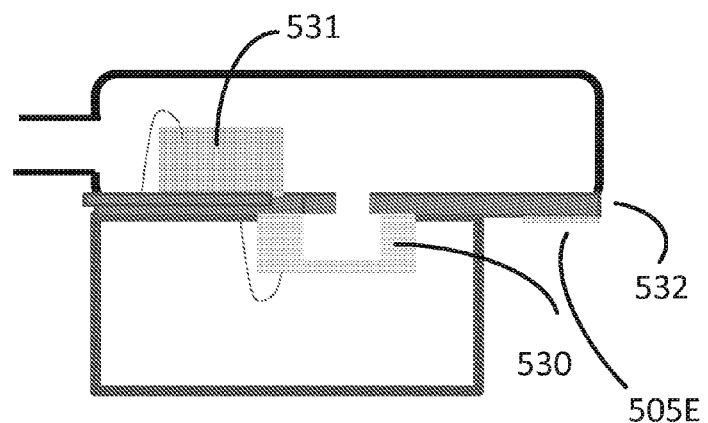
Figure 5H:
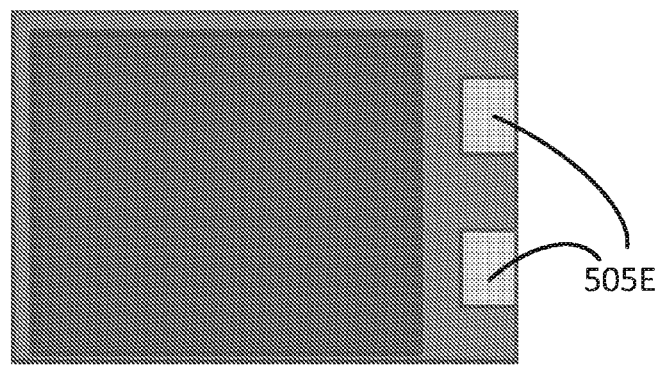

Yet another embodiment is schematically illustrated in FIGS. 5G and 5H. In this embodiment, the microphone element 530 and ASIC 531 are on opposite sides of the substrate 532, with an interface pad array 505E on the same side of the substrate 532 as the microphone element 530. Related embodiments could include an interface pad array 505 on the side opposite the microphone element 530.

An alternate embodiment is schematically illustrated as microphone module 600 in FIGS. 6A-6D. This embodiment 600 includes a flanged sound pipe 601 rather than a housing 510/410/etc. (i.e., another type of housing). As discussed below with regard to FIG. 6E, the flanged sound pipe 601 has a flange 602, and a sound pipe 603 extending from the flange 602. Other components of the microphone module 600 are similar to microphone module 400 in FIGS. 4A-4B, including a substrate 401, lid 406, microphone element 403, ASIC 404 and interface pads 405. Of course, the flanged sound pipe 601 also can be used with the embodiments discussed with regard to FIGS. 5A-5H. In that case, like the embodiment of FIG. 4A-4B, the flanged sound pipe 601 is used in place of the housing 510.

Unlike the comparable portion of the housing 401, however, the flange 602 does not define an appreciable second volume with the substrate 401 (i.e., it forms only a very small second volume or no second volume—if the second volume does not include the volume of the sound pipe 603). Instead, the flange 602 of flanged sound pipe 601 rests substantially flush against the substrate 401 such that the sound pipe 603 is adjacent to and in acoustic communication with the aperture 402. In this way, the sound pipe 603 guides sound from its distal end 604 to the microphone 403.

This embodiment the sound pipe also includes a bend 605. The bend 605 provides additional flexibility to a system designer by allowing the sound pipe to run from the microphone module 600 to a distal sound source without requiring the sound pipe 601 to follow a straight line path. The flange can be attached to the substrate using many different techniques know in the art, including soldering, conductive or non-conductive adhesives, or other fixing methods. Alternatively, the sound pipe could have no flange and be attached directly to the substrate using known methods. Of course, rather than have a bend, the sound pipe could be straight, as in sound pipe 621 in the microphone module 620 in FIG. 6C.

Figure 6A:
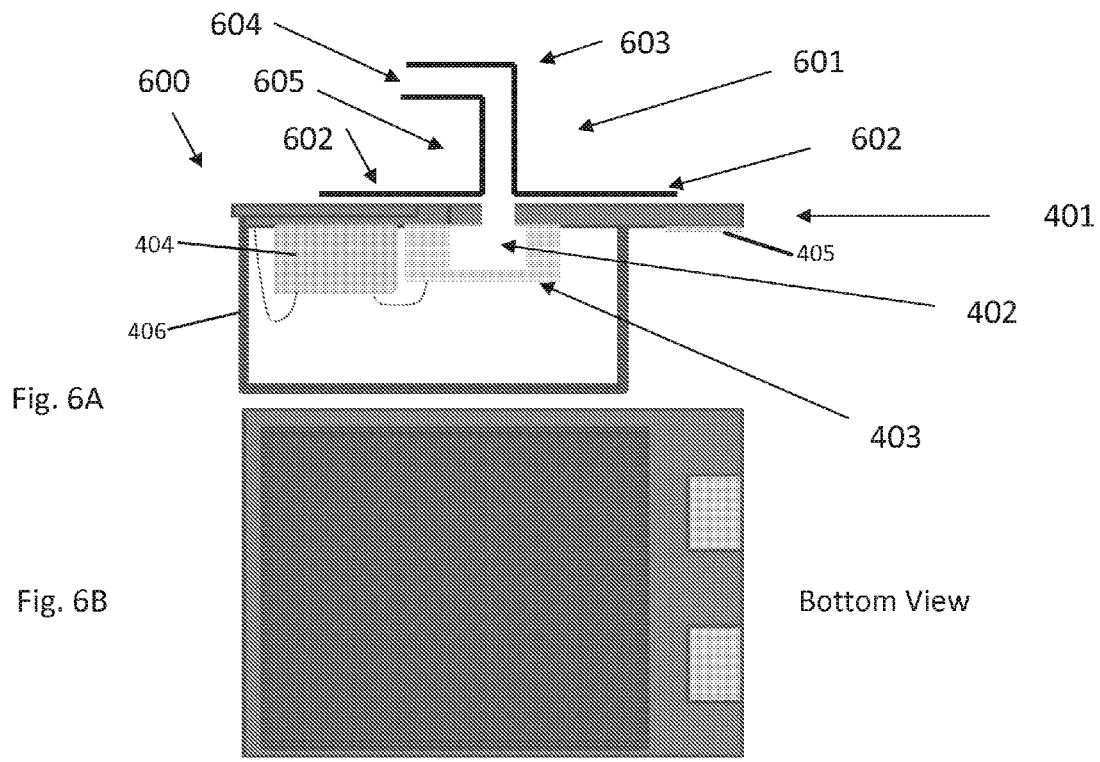
Figure 6C:
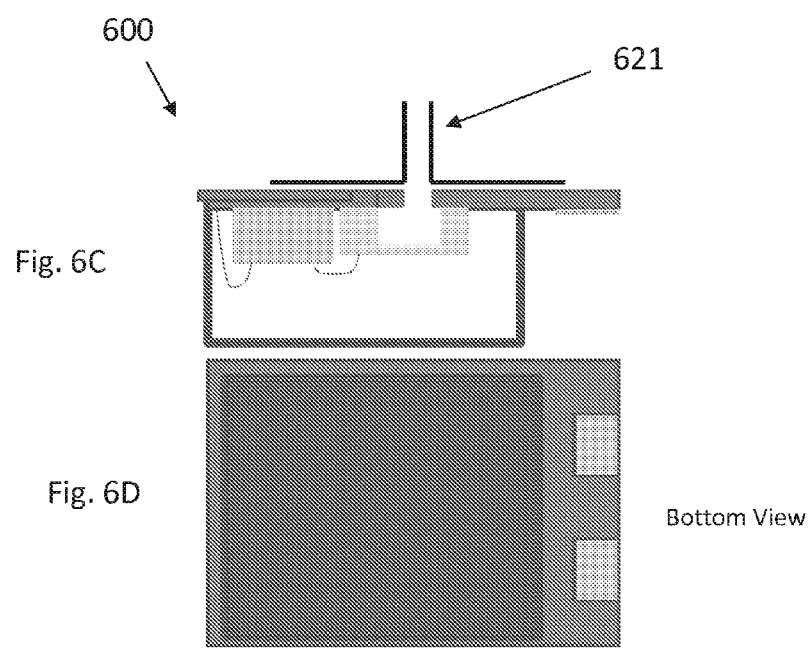
Figure 6E:
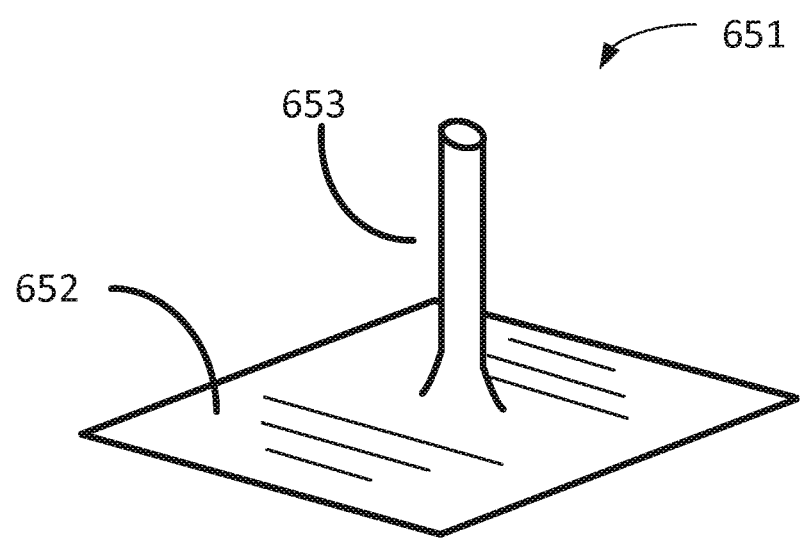
FIG. 6E schematically illustrates an embodiment of a flanged sound pipe.

An embodiment of a flanged sound pipe 651 is schematically illustrated by a perspective view in FIG. 6E, and includes flange 652 and sound pipe 653. The flange 652 in this embodiment is generally planar, and is configured to mount to a face of a housing or substrate, or other planar surface. The flange 652 is square, and is generally normal to the sound pipe 653. However, in other embodiments, the flange 652 could take a variety of shapes, and could be angled with respect to the sound pipe 653.

The sound pipe 653 in this embodiment has a cross-section that is circular, and flares slightly where it meets the flange 652. However, the shape of the cross-section could also be described by another conic section, or be rectangular, to name just a few examples.

Figures 7A, 7C:
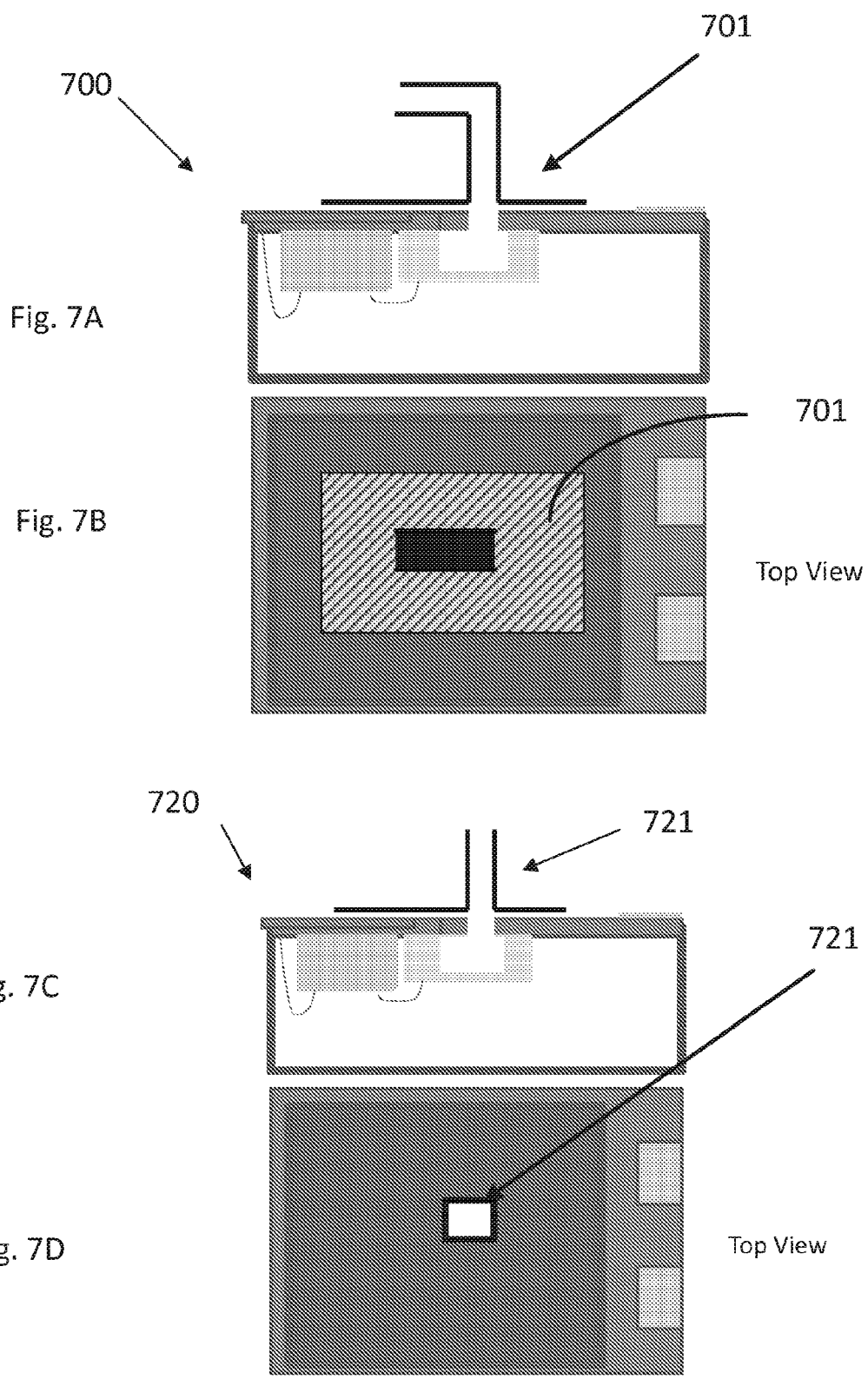

Another embodiment of a microphone module 700 is schematically illustrated in FIGS. 7A and 7B. The embodiment 700 has a flanged sound pipe 701, and is otherwise similar to the embodiments in FIGS. 5A-5H.

A similar embodiment 720 is schematically illustrated in FIGS. 7C and 7D, except that the sound pipe 720 is straight, similar to the sound pipe 620 in FIG. 6C. FIG. 7C shows sound pipe 721 in cross-section profile, and reveals that the cross-section is rectangular. However, the cross-section of a sound pipe, in a plane normal to its length, can take any shape, including square, rectangular, conic-section, or any other shape. For example, FIG. 6E schematically illustrates a perspective view of a flanged sound pipe 601 having a flange 602 and a sound pipe 603 with a circular cross-section.

Figure 8:
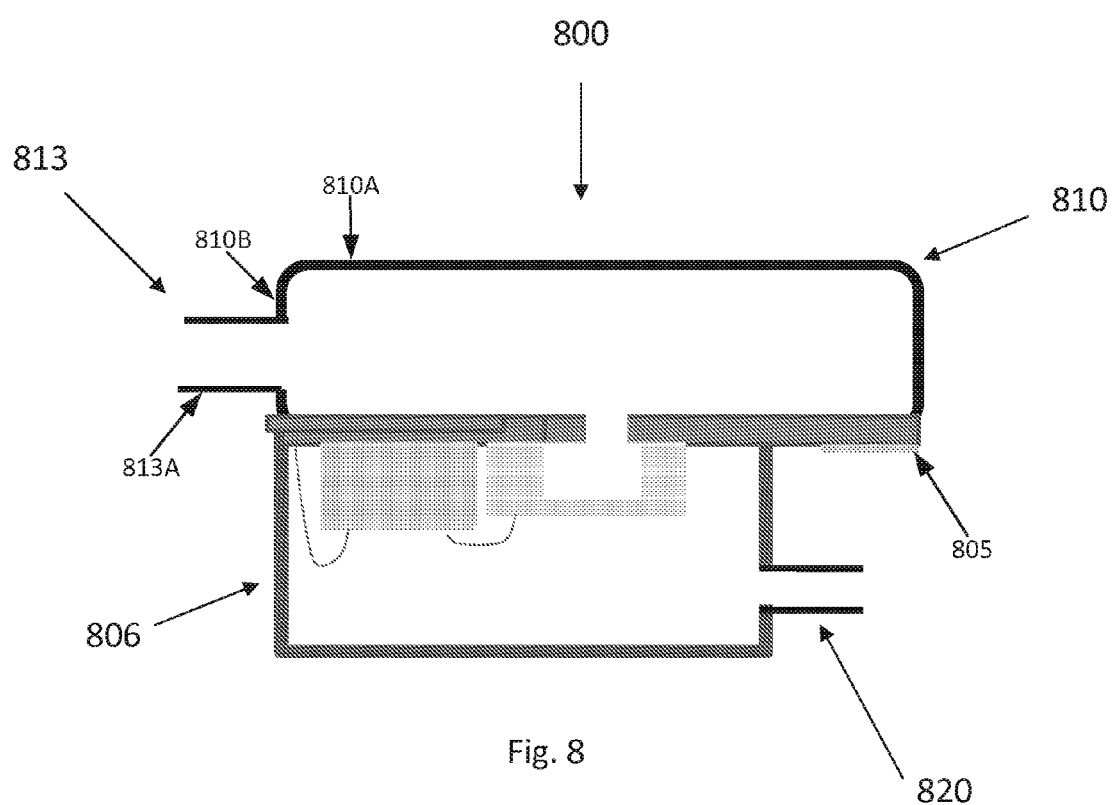
FIG. 8 schematically illustrates an embodiment of a microphone module.

Some embodiments have more than one acoustic aperture. One such embodiment is schematically illustrated as microphone module 800 in FIG. 8. In this embodiment, the lid 806 and the housing 810 each have an acoustic aperture 813 and 820, respectively. The acoustic apertures 813 and 820 can take the form of sound pipes, or could also be holes, or a combination of a sound pipe and a hole. As discussed above, rather than extend from housing side 810B, the sound pipe 813A can extend from the top side 810A of the housing 810. Moreover, as noted above, this embodiment can have a single sound pipe/aperture combination rather than two (e.g., just a sound pipe/aperture combination 813 extending from the housing 810).

Figure 9:
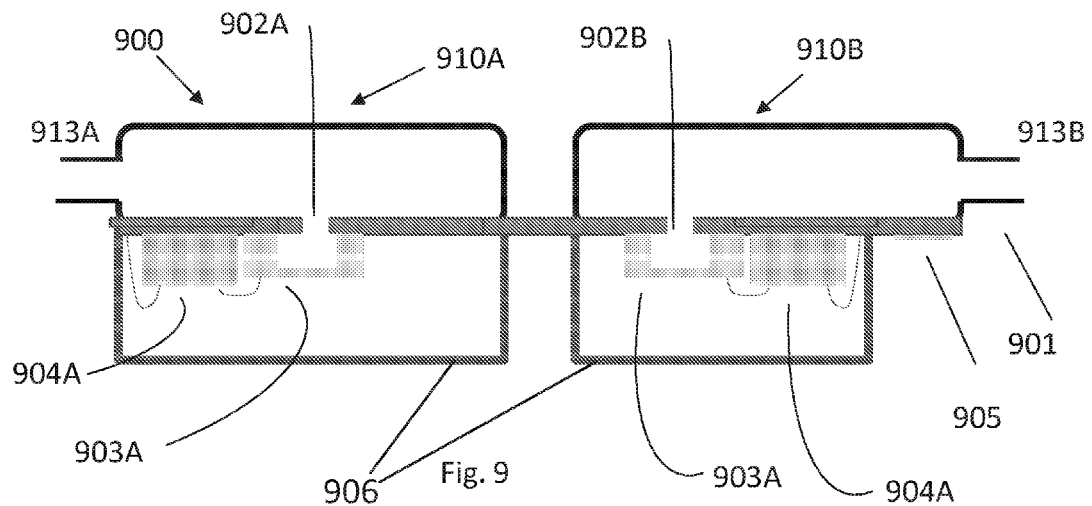
FIG. 9 schematically illustrates an embodiment of a microphone module.

Several embodiments may have multiple lids, housing and microphones. For example, a dual-module 900 is schematically illustrated in FIG. 9. The dual module 900 has a single substrate 90 supporting two lids 901A and 901B and two housings 910A and 910B. Each lid 901A and 901B houses a microphone 903A and 903B, respectively, and an ASIC 904A and 904B respectively. Each microphone 903A and 904B straddles an aperture, 902A and 902B, respectively. Each housing 910A and 910B has an acoustic port 913A and 913B, which are similar in structure to the acoustic ports in previously-described embodiments. The dual-module 900 has at least one interface pad 905 that may serve one or both segments of the dual module. In this embodiment, the interface pad 905 is on the same side of the substrate as the lids 906A and 906B, but one or more pads 905 could also be on the other side, but outside the housing 910B. Some embodiments contain several interface pads 905, which can be independent (i.e., so that both microphones 903A and 904A are independently electrically accessible). Moreover, some interface pads 905 may be independent while other interface pads 905 are shared by the two microphones 903A and 904A. Although the embodiment in FIG. 9 shows two microphones, some embodiments may have three or more microphones, each with its own lid and housing. Alternately, some microphone systems may have multiple lids 906, but only a single corresponding housing 910.

Figure 10:
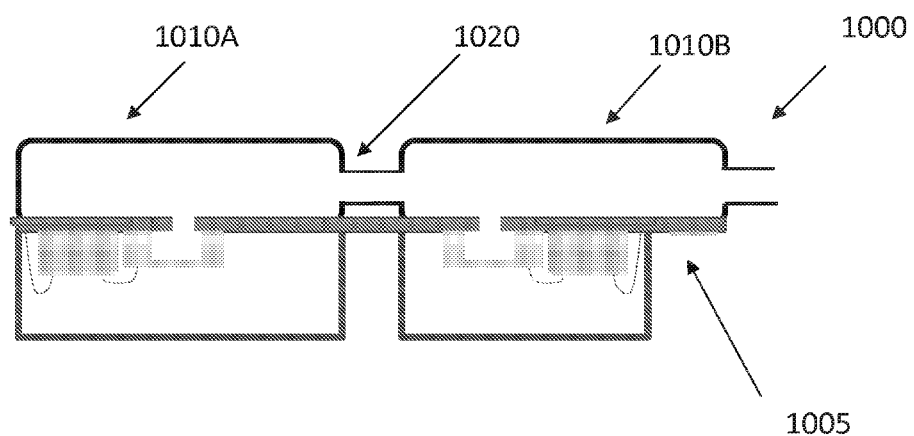
FIG. 10 schematically illustrates an embodiment of a microphone module.

In an alternate embodiment 1000, two housings 1010A and 1010E are acoustically coupled by a bridge 1020, as schematically illustrated in FIG. 10. The bridge 1020 allows a single acoustic aperture or sound pipe 1013 to guide incoming sound signals to both housings, and ultimately to their associated microphones. Alternately, the housings 1010A and 1010B, which are connected by bridge 1020, could be considered to be a single housing. The dual-module 1000 has at least one interface pad 1005 that serves both segments of the dual module. In this embodiment, the interface pad 1005 is on the same side of the substrate as the lids 1006A and 1006B, but one or more pads could also be on the obverse side, but outside the housing 1010B.

Figure 11:
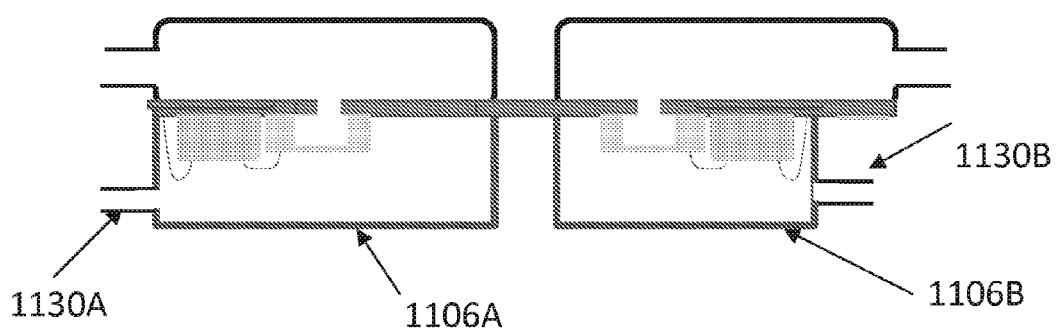
FIG. 11 schematically illustrates an embodiment of a microphone module.

Yet other dual-module embodiments may also have one or more acoustic ports 1130A and 1130B in their respective lids 1106A and 1106B, as in dual-module 1100 as schematically illustrated in FIG. 11.

Figure 12:
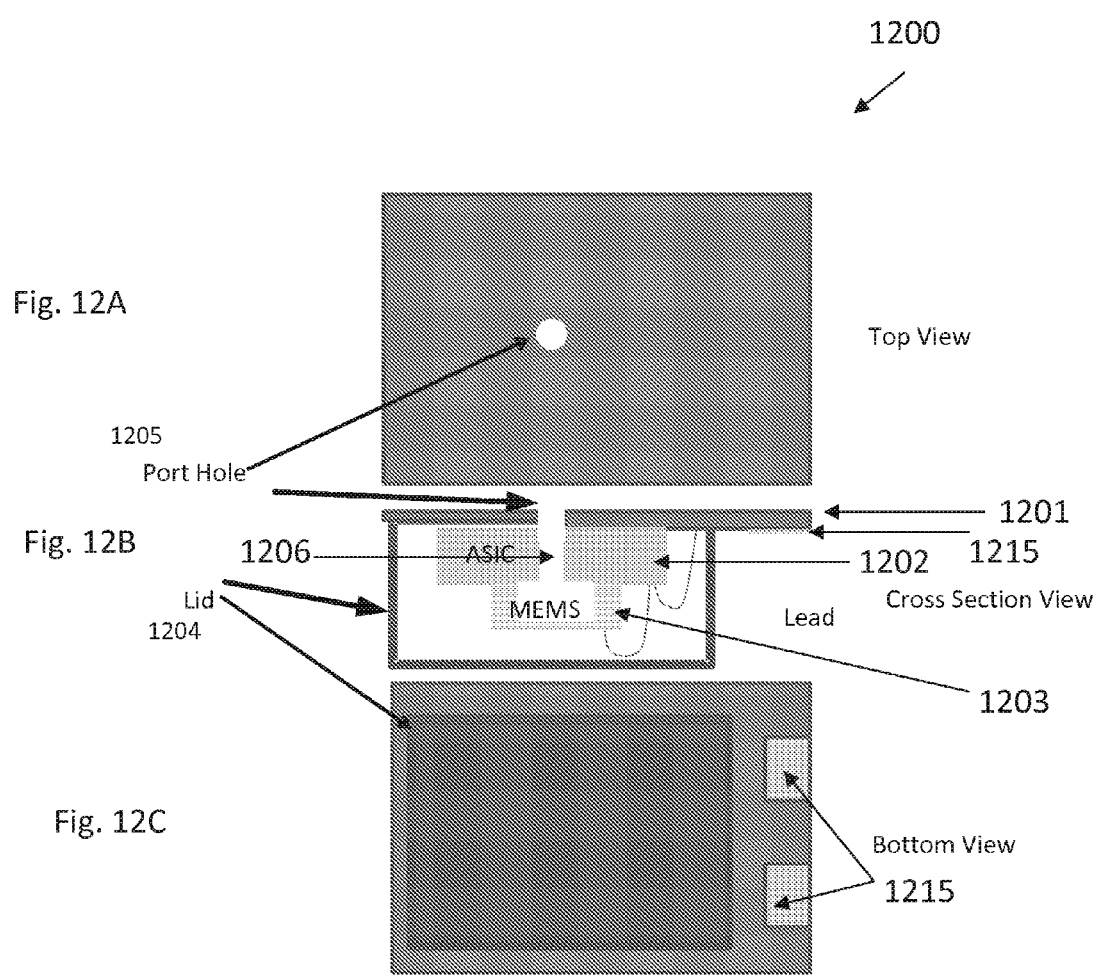
FIGS. 12A-12C schematically illustrate an embodiment of a microphone module.

Other embodiments provide interface pads on a portion adjacent to a lid. For example, as shown in FIG. 12, a microphone system 1200 includes a substrate 1201 supporting an ASIC 1202 with a stacked MEMS microphone 1203 covered by a lid 1204. The substrate 1201 includes an aperture 1205 (which may also be known as a "port hole") acoustically coupled to an ASIC aperture 1206 in ASIC 1202, so that sound may pass through the substrate aperture 1206 to reach microphone 1203. A number of interface pads 1215 reside on the surface of substrate 1201, on the same side as lid 1204. Other embodiments, however, may have interface pads on the other side of the substrate 1201. One or both of the ASIC 1202 and microphone 1203 may be electrically coupled to the interface pads 1215 to provide an accessible means of electrically communicating with a host system.

As with other disclosed embodiments, the interface pads 1215 can be connected by a variety of interconnect means, such as wire bonds, solder, epoxy or ACF to a printed circuit ("PC") board, or a laminate, to name but a few. Some embodiments may include an array of interface pads along an edge of the substrate, such that the interface pads may be inserted into a socket, such as a linear socket on a computer's backplane, for example. This embodiment 1200 may be used with a housing and/or a sound pipe (e.g., a flanged sound pipe) as illustrated in other embodiments herein, but may also be surface-mounted—for example by interface pads, or by coupling the substrate 1201 to a surface of a host system. Therefore, the embodiment 1200 provides a host system designer with considerable flexibility.

Figure 13:
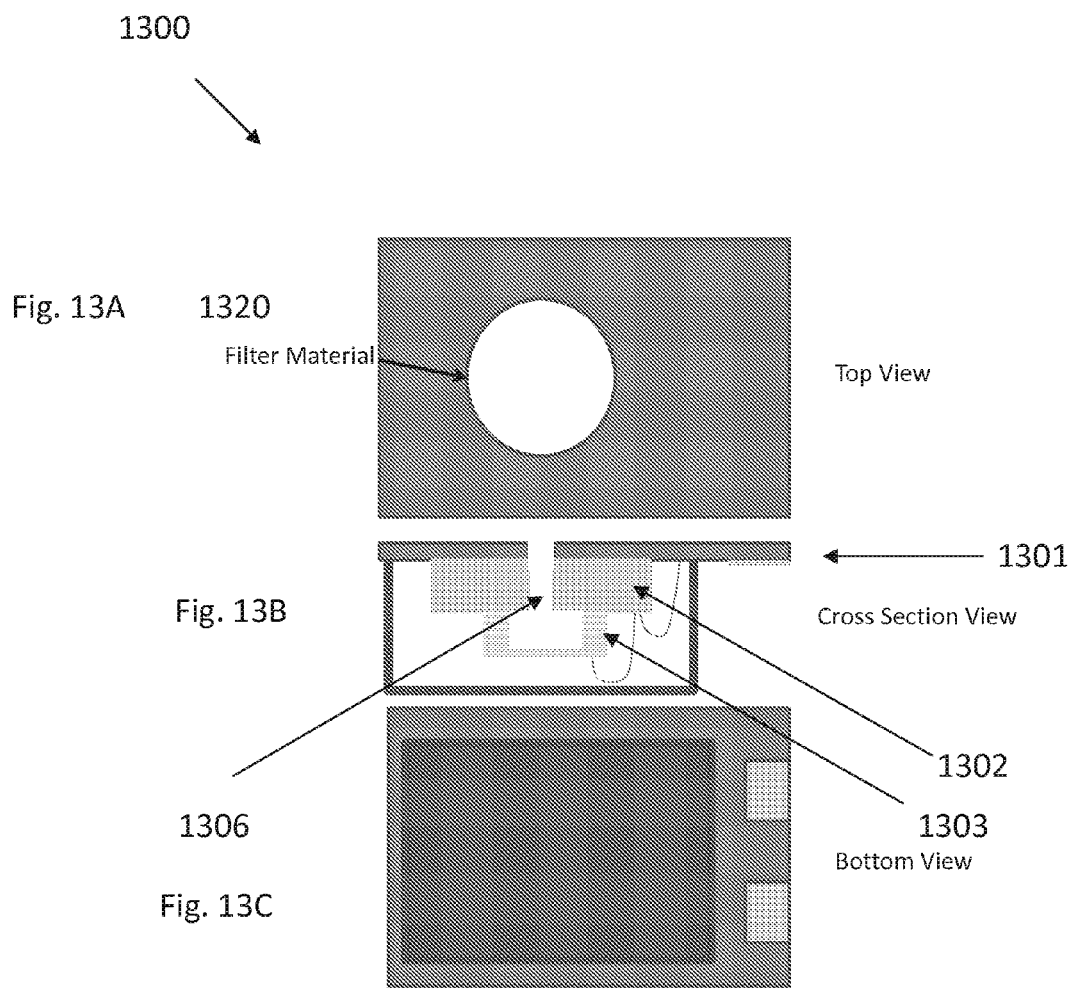
FIGS. 13A-13C schematically illustrate an embodiment of a microphone module.

Various embodiments, including each of the embodiments described above, may include a filter in one or all of their substrate apertures, acoustic ports, and/or a sound pipes. One embodiment 1300 is schematically illustrate in FIGS. 13A-C, in which a substrate 1301 supports/hosts an ASIC 1302 with a stacked MEMS microphone 1303 covered by a lid 1304. As with other lids described above, the lid 1304 may be attached to the substrate 1301 to create a volume that is partially occupied by the ASIC 1302 and microphone 1303.

In this embodiment, a filter material resides either within the aperture 1306, or on a top or bottom face of substrate 1301 covering the aperture. In an embodiment with a laminate substrate, the filter may be part of a laminate layer, or may be sandwiched between two laminate layers, for example. Depending on its construction, the filter 1320 may prevent objects, dust or other particulate matter, light, moisture or other environmental contaminants from passing through the aperture 1306. Of course, the filter 1320 permits acoustic signals enter the interior to contact the microphone 1303.

A filter may take a variety of forms. For example, the filter may be a screen, a gauze member, a PTFE filter, a metal member, or a ceramic member.

In an embodiment 1500 schematically illustrated in FIGS. 15A and 15B, the housing 1501 is made of laminate structures, including one or more sidewalls 1502 and a top 1503. In the embodiment of FIGS. 15A and 15B, a sound pipe 1504 extends from lid 1505, while other embodiments include a sound pipe extending from the housing 1501. Further, a number of interface pads 1506 reside on the outer surface 1507 of the housing 1501. The interface pads 1506 may connect to the substrate 1510, microphone element 1511, and/or ASIC 15121 through conductors on or in the laminate structures 1502 and 1503.

Figure 17A:
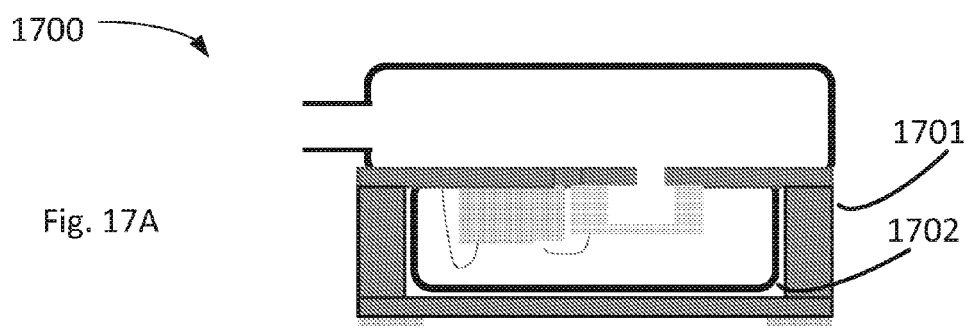
FIGS. 17A and 17B schematically illustrate an embodiment of a microphone module.
Figure 17B:
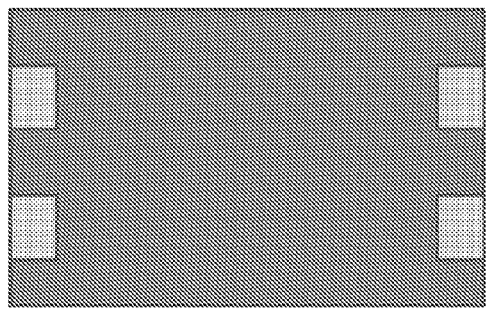

Some embodiments include a shell outside of the housing and/or the lid. For example, the embodiment 1600 schematically illustrated in FIGS. 16A and 16B includes a shell 1601 outside of (or surrounding) lid 1602. A number of interface pads 1603 reside on the outer surface 1604 of the shell 1601, and may connect to the substrate 1610, microphone element 1612, or ASIC 1611 through conductors on or in the laminate structures. The lid 1602 lends structural support to the shell 1601, and may also provide electromagnetic shielding to the microphone system 1600. At the same time, the shell 1601 provides interface pads on the housing-side of the microphone system. Similarly, another embodiment 1700 (FIGS. 17A and 17B) includes a shell 1701 outside of (or surrounding) lid 1702.

Another embodiment 1800 is schematically illustrated in FIGS. 18 and 19. In this embodiment, a substrate 1801 has a microphone 1802 and an ASIC 1803 on one surface 1801A. A lid 1804 is also coupled to the surface 1801A, and covers the microphone 1802 and ASIC 1803, and also spans an aperture 1806 through the substrate 1801. A shell 1805 is coupled to the surface 1801A, and includes interface pads 1807. The embodiment 1800 does not include a housing with a large volume on the side opposite surface 1801A. However, some embodiments, such as the one schematically illustrated in FIG. 18, do include a flanged sound pipe 1808 (i.e., another type of housing) interfaced with the aperture 1806. It is note that the inclusion of a shell, such as the shells discussed above, do not require a housing or a flanged sound pipe 1808, even though the examples discussed above include such features.

As noted above, some embodiments include a filter, such as the embodiment having reference number 2000 and schematically illustrated in FIGS. 20A-C. More specifically, this embodiment includes a filter 2001 covering an aperture 2002 in substrate 2003. In this embodiment, the filter (or "filter material") 2001 is on the surface 2003A of substrate 2003, which is the side of substrate 2003 opposite to the side that hosts/supports an ASIC 2004 and microphone element 2005. In other embodiments, however, a filter or filter material (or additional filter or filter materials) could be within the aperture 2002, or between the substrate 2003 and ASIC 2004.

The filter 2001 may also have acoustic properties that delay the travel of a sound signal. Inclusion of such a filter in a microphone system may be desirable in a system that has multiple microphone elements, for example, to adjust the receipt time of a signal by one microphone element with respect to the receipt of the signal by another microphone element. Alternately, a filter may enhance or accentuate the directional sensitivity of a directional microphone in which a sound signal reaches a microphone element via two paths between the source of the sound signal and the microphone element, where at least one of the paths includes a filter that delays propagation of the sound signal.

Figure 20D:
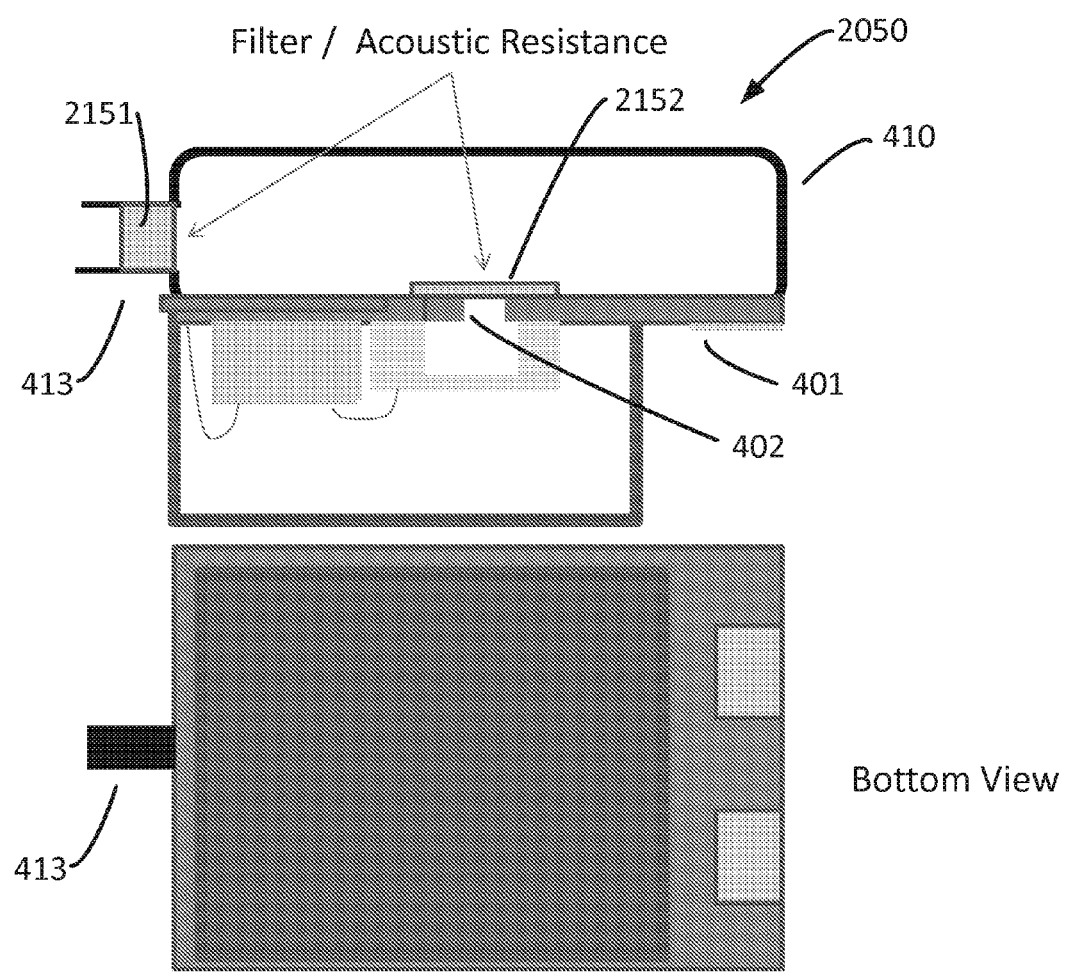
FIG. 20D schematically illustrates an embodiment of a microphone module.

Another embodiment 2050 having one or more filters 2001 is schematically illustrated in FIG. 20D. This embodiment is similar to the microphone system 400 of FIG. 4, and some reference numbers from that embodiment are re-used in FIG. 20D. This embodiment of a microphone system 2050 shows two filters, 2051 and 2052, although the system may alternately be configured with only one filter. Filter 2151 occupies a portion of sound pipe 413, or could be coupled to the inner surface of the housing 410 covering the pipe aperture, while filter 2152 straddles aperture 402 in substrate 401, on surface 401B. In addition to introducing an acoustic delay, the one or more filters may serve a more traditional filtering purpose, such as blocking moisture, dust and other particulate matter or other contaminants, from entering the microphone system 2050, or from passing through the aperture 402, for example. As in various embodiments, the sound pipe can alternatively be an aperture.

Some embodiments include multiple microphone packages associated with a single acoustic port module. For example, an acoustic port module 2101 is schematically illustrated in an embodiment 2100 in FIG. 21. The acoustic port module 2101 in this embodiment includes an enclosed volume 2102, and a sound pipe 2103. The acoustic port module 2101 may be metal, plastic, or ceramic, or other material. In some embodiments, the acoustic port module 2101 may include printed circuit board having conductors and/or interface pads to electrically couple microphone circuits to a host system.

An external acoustic signal may enter the enclosed volume 2102 via the sound pipe 2103, and pass through to two microphone elements 2104 and 2105 via two apertures 2106 and 2107, respectively. In this way, each microphone element 2104 and 2105 has the benefit of sharing a common sound pipe 2103 owing to the common acoustic port module 2101. Such an arrangement may make the microphone system 2100 more compact than systems in which each microphone element has its own housing. In some embodiments, exposing the microphone elements 2104 and 2105 to a common sound pipe (in other words, to a common acoustic port) may facilitate allowing the incoming sound to reach the microphone elements 2104 and 2105 at the same time, or with a determinable phase or time differential.

The microphone system 2100 also includes coupling elements 2110 and 2111. Coupling element 2110 has a tube portion 2112 and a flange portion 2113. Tube portion 2112 passes through apertures 2106, while flange portion 2113 is outside of acoustic port module 2101. The flange portion 2113 couples to microphone package 2114 such that the tube portion 2112 is acoustically coupled to an aperture 2114A in package 2114. In other words, the tube portion 2112 and package aperture 2114A form a hole between internal volume 2102 and the interior of the microphone package 2114. The flange portion 2113 provides a planar surface to meet the outer surface of package 2114. The interface between the flange portion 2113 and the package 2114 provides a structural interface, and in some embodiments may create a seal between the acoustic port module 2101 and the package 2114.

Figure 22A:
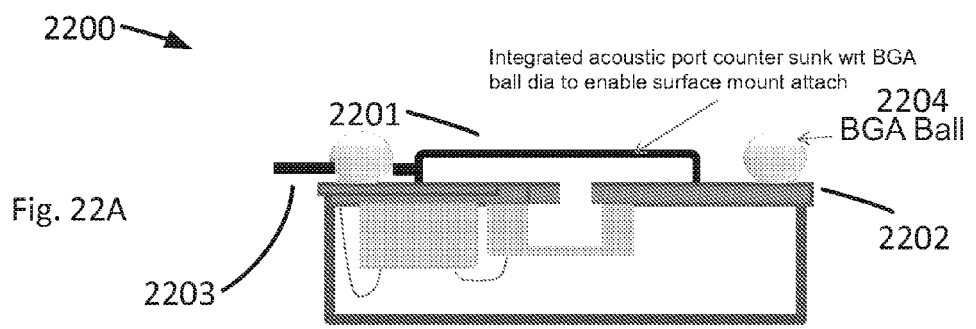
FIGS. 22A and 22B schematically illustrate an embodiment of a microphone module.
Figure 22B:
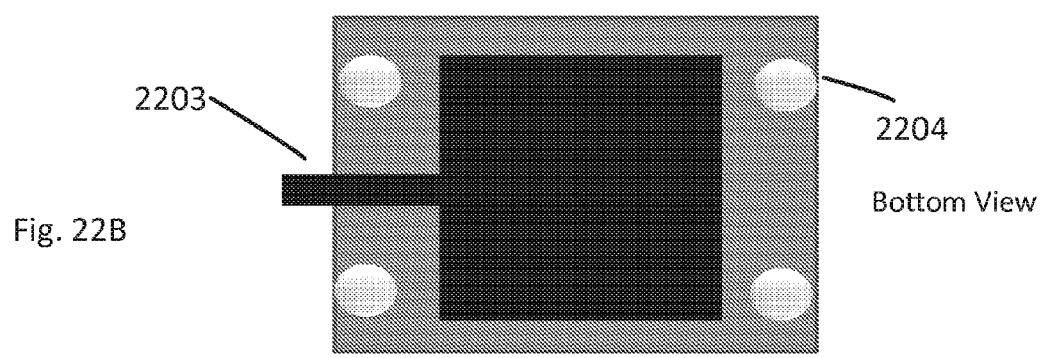

A ball-grid-array mountable embodiment of a microphone system 2200 is schematically illustrated in FIGS. 22A and 22B. A housing 2201 is coupled to substrate 2202. The housing 2201 includes a sound pipe 2203 that passes between solder balls 2204 on a surface of the substrate 2202. The diameter of the solder balls 2204 exceeds the height of the housing 2201, so that the solder balls 2204 may mount to a surface without physical interference from the housing 2201. Such an arrangement allows the microphone system 2200 to have electrical communication with a host system via solder balls 2204, rather than (or in addition to) including interface pads on the housing 2201, for example.

Figure 23A:
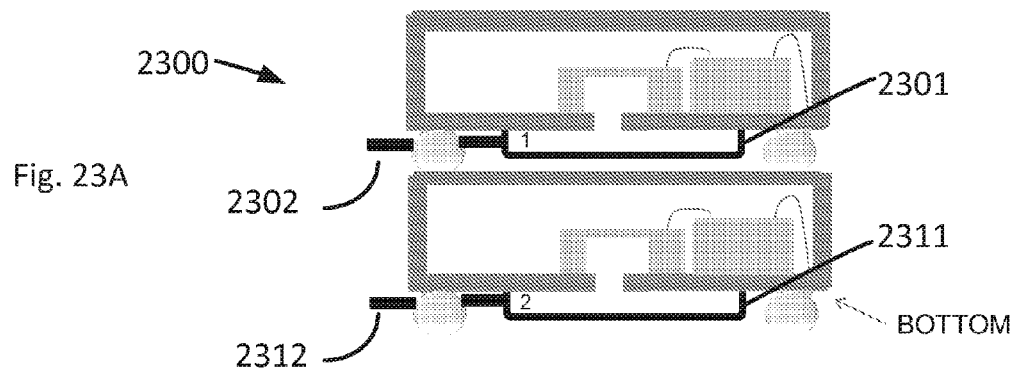
FIGS. 23A and 23B schematically illustrate an embodiment of a microphone module.
Figure 23B:
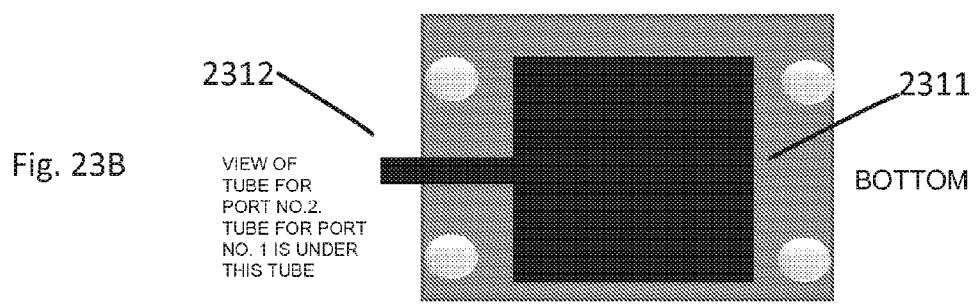

Some embodiments may include more than one ball-grid-array mountable device. For example, the microphone system 2300 schematically illustrated in FIGS. 23A and 23B includes two such devices, each of which is similar to the embodiment in FIGS. 22A and 22B. Each housing 2301 and 2311 includes a sound pipe 2302 and 2312, respectively, although the two sound pipes 2302 and 2312 need not extend in the same direction. In some embodiments, the sound pipes 2302 and 2312 extend in different directions (e.g., at 90 degree angles to one another, for example) to provide the system 2300 with access to sounds from different directions, or to a single sound source from multiple angles.

Some embodiments provide a double-chambered package. Package 2400, as schematically illustrated in FIGS. 24A and 24B, includes a microphone chamber 2401, which houses a microphone 2410, and a backchamber 2402. The backchamber 2402, which may also be thought of as a housing, includes a sound pipe 2420 to allow entry of acoustic energy. The package 2400 may be a molded member, or a combination of one or more members 2401A and 2401B. The package 2400 may be of a variety of materials, such as metal, ceramic, or is metallized polymer, for example. An outer surface of the backchamber 2402 includes one or more interface pads 2404 for connecting the package 2400 to a host system.

An aperture 2406 opens the microphone chamber 2401 to the environment outside of the package 2400 to allow sound to enter the microphone chamber 2401. An aperture 2403 acoustically couples the microphone chamber 2401 to the backchamber 2402.

Another embodiment schematically illustrated in FIGS. 25A and 25B places interface pads 2504 on a surface 2501A of the package 2500 outside of the microphone chamber 2501. The backchamber 2502, which may also be thought of as a housing, includes a sound pipe 2520 to allow entry of acoustic energy.

An embodiment of a multiple microphone system 2600 is schematically illustrated in FIGS. 26A and 26B. A microphone 2601 is within a microphone chamber 2602. The chamber 2602 is acoustically coupled to a housing 2603 via an aperture 2604 and a coupling element 2605, similar to the coupling elements described above. A second microphone chamber 2610 and second housing 2611 are coupled to the first housing 2603 by solder balls 2606. Each of the housings 2603 and 2611 have a sound pipes 2620A and 2620B, respectively, extending outwardly to allow external sound signals to enter the housing and reach the microphones 2601 and 2613. The bottom housing 2611 also includes an array of interface pads 2615.

Figure 27:
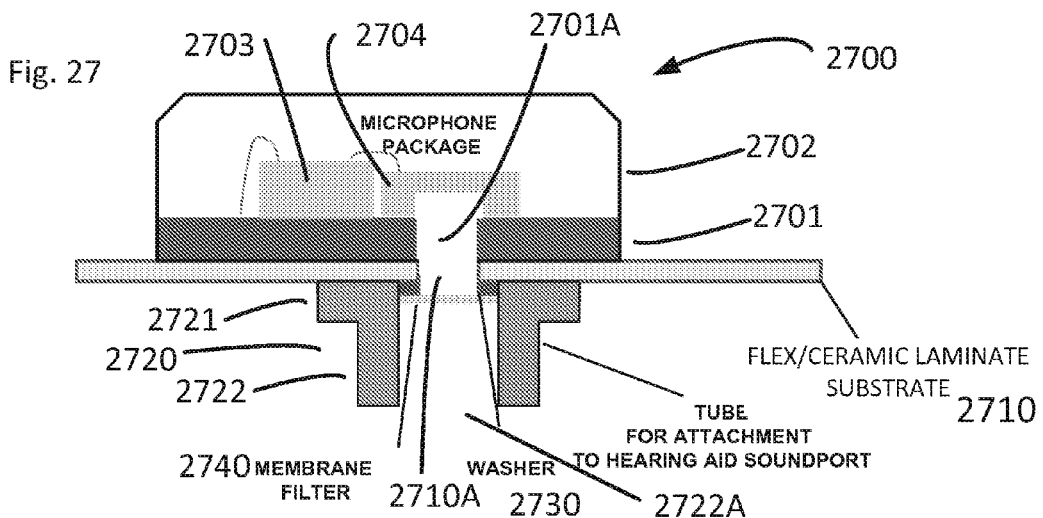
FIG. 27 schematically illustrates an embodiment of a microphone module.

In addition to the embodiments described above, there are a variety of other ways to connect a sound pipe to a microphone system. For example, FIG. 27 schematically illustrates a microphone package 2700 having a base 2701 and lid 2702 mounted on the base 2701. In this embodiment, the base 2701 includes an aperture 2701A, and supports an ASIC 2703, and a microphone element 2704 straddling the aperture 2701A.

The microphone package 2700, in turn, is mounted to a substrate 2710, which may be part of a host system. In particular, the aperture 2701A of package 2700 is mounted over an aperture 2710A in the substrate 2710 so that the two apertures provide a sound path to the microphone element 2704. On the opposite side of the substrate from the microphone package 2700 is a coupling tube 2720.

The coupling tube 2720 has a flange portion 2721 and an adapter portion 2722. The flange portion 2721 may be secured to substrate 2710 by a variety of means known in the art, such as epoxy or conductive epoxy, for example, and the adapter portion 2722 extends away from the substrate 2710 to meet a corresponding sound tube (not shown). The sound tube may couple to the adapter portion 2722 in a variety of ways. For example, the sound tube may fit within the opening 2722A of the adapter portion, or the adapter portion 2722 may fit within the sound tube, to name but a few alternatives.

The embodiment schematically illustrated in FIG. 27 also has a washer 2730 and a membrane filter 2740. The washer 2730 is coupled directly to the substrate 2710 within the coupling tube 2720, and helps to seal the interface of the coupling tube 2720, filter 2740, and the substrate 2710. Further, the washer 2730 may be secured to the substrate 2710, and the filter 2740 may, in turn, be secured to the washer 2730, so that the filter 2740 and washer 2730 cooperate to secure each other to the substrate and/or even to the inside of the coupling tube 2720.

Figure 28:
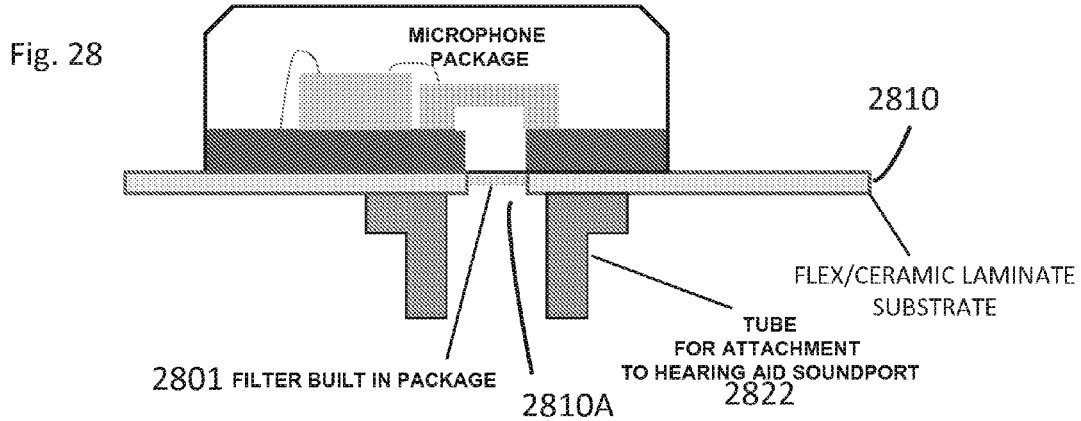
FIG. 28 schematically illustrates an embodiment of a microphone module.

An alternate embodiment shown in FIG. 28 and identified by reference number 2800 has a filter 2801 within the aperture 2810A of substrate 2810. This embodiment does not include a washer, although a washer could be included on the substrate 2810 within the coupling tube 2822.

Figure 29:
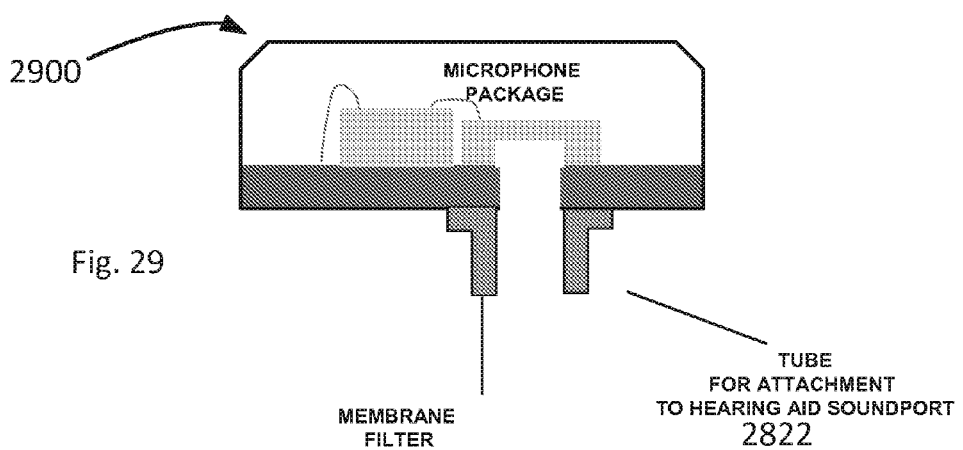
FIG. 29 schematically illustrates an embodiment of a microphone module.

Other embodiments may forgo the filter and washer entirely, as in embodiment 2900 schematically illustrated in FIG. 29.

Figure 30:
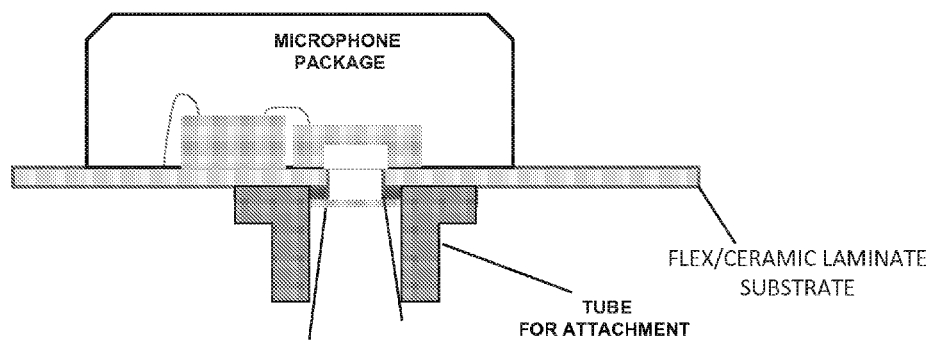
FIG. 30 schematically illustrates an embodiment of a microphone module.
Figure 31:
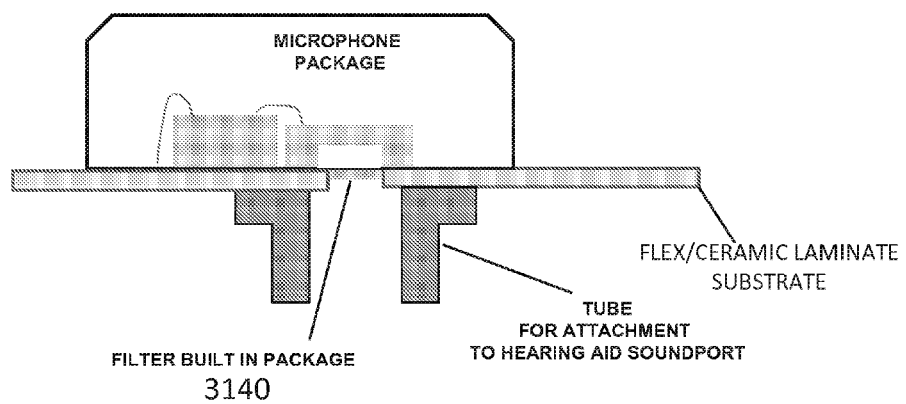
FIG. 31 schematically illustrates an embodiment of a microphone module.

Alternate embodiments include a microphone package formed by a lid mounted directly to a substrate within a host system. In other words, the microphone package may forgo a base (e.g., base 2701 in FIG. 27). Such embodiment may still include a filter, such as filter 3140 in FIG. 31, for example, or a cooperating filter 3040 and washer 3030 as in FIG. 30, for example.

Figure 32A:
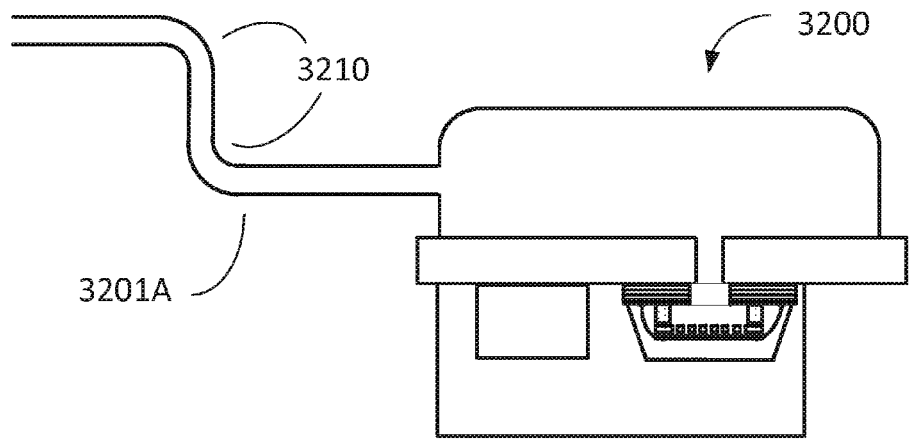
FIGS. 32A-32E schematically illustrate ways by which a sound pipe may interface to a microphone module.

Several embodiments described herein include a sound pipe extending from a housing or a lid. Illustrations of such sound pipes may show the sound pipes as relatively short. However, that is not necessarily the case. For example, FIG. 14 schematically illustrates a sound pipe 1404 extending a considerable distance from the microphone system 400. As another example, FIG. 32A schematically illustrates a sound pipe 3201A extending far from a microphone system 3200. In this embodiment, the sound pipe also includes corners or bends 3210.

Figure 32B:
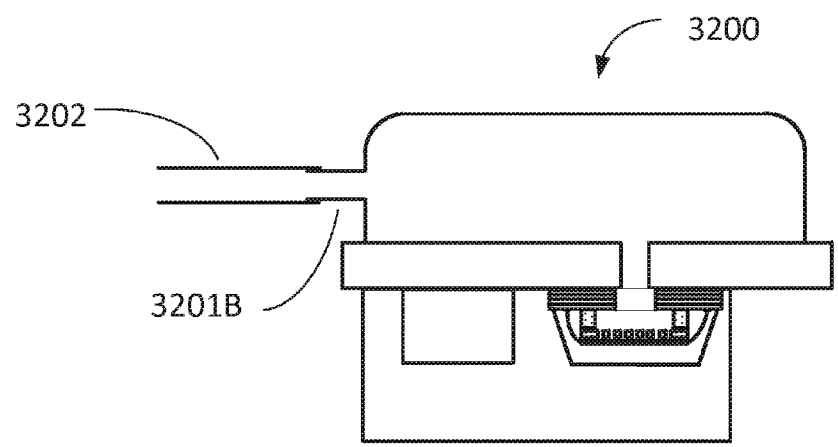

Other embodiments provide a variety of ways to interface an extended sound tube to a microphone system. For example an embodiment in FIG. 32B includes a sound pipe 3201B extending a short distance from microphone system 3200. An extended sound pipe 3202 (which may also be known as a "sound pipe extension") couples to sound pipe 3201B. In particular, the inside diameter (or inside dimensions) of sound pipe extension 3202 are greater than the outside diameter (or outside dimensions) of sound pipe 3201B such that sound pipe extension 3202 fits over the sound pipe 3201B.

Figure 32C:
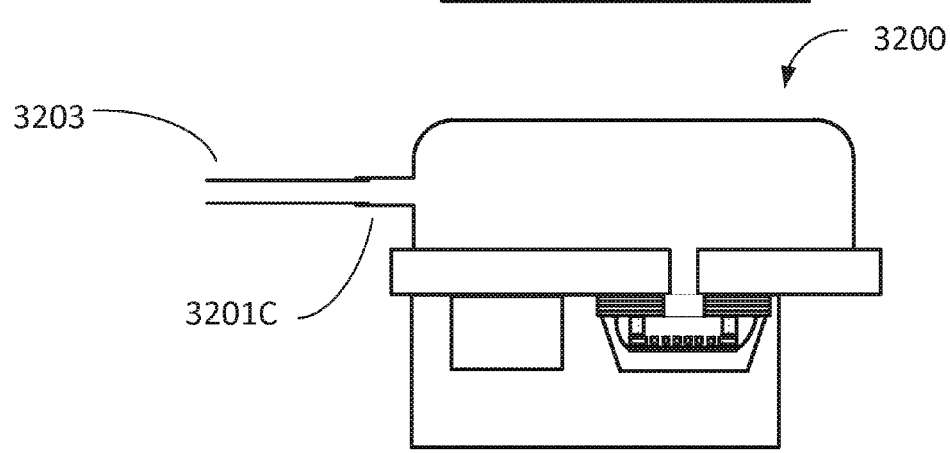

In an alternate embodiment schematically illustrated in FIG. 32C, the outside diameter (or outside dimensions) of sound pipe extension 3203 are less than the inside diameter (or inside dimensions) of sound pipe 3201C such that sound pipe extension 3203 fits within the sound pipe 3201C.

Figure 32D:
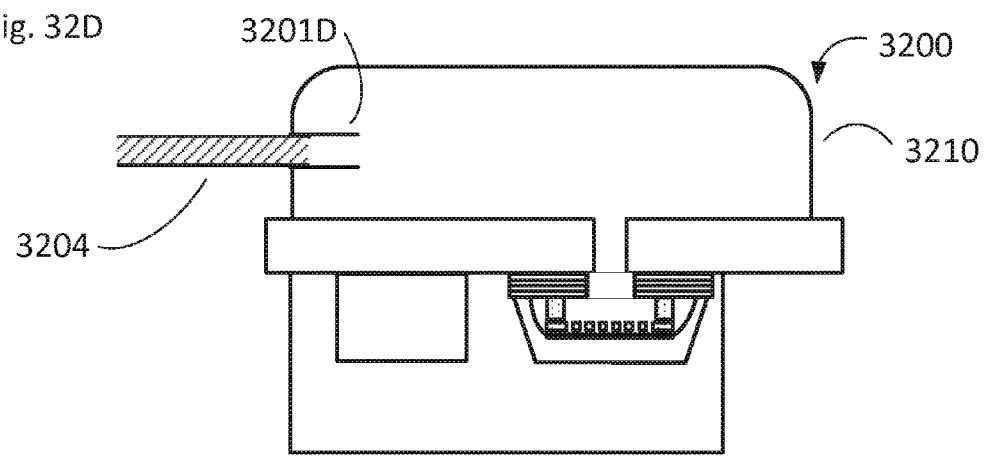

Yet another embodiment is schematically illustrated in FIG. 32D, in which a sound pipe adapter 3201D extends into the interior volume of housing 3210. Sound pipe extension 3204 then inserts into sound pipe adapter 3201D to guide sound into the housing 3210.

Figure 32E:
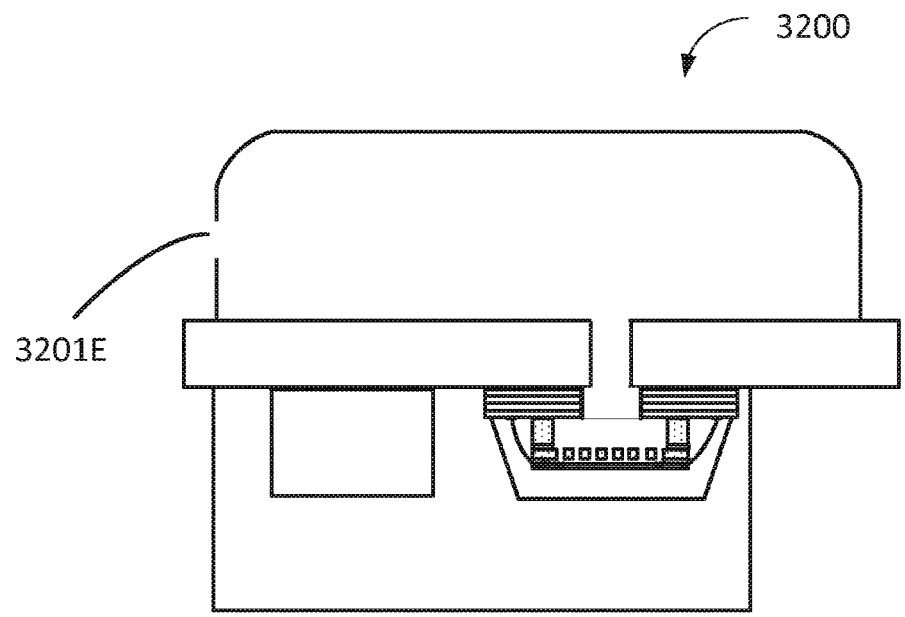

In another embodiment schematically illustrated in FIG. 32E, a sound pipe could interface directly to aperture 3201E.

Various embodiments discussed above therefore provide a system designer with more choices and greater flexibility in designing the host system, and selecting the shape and size of a microphone module, and locating and mounting the microphone module within the host system.

The embodiments of the invention described above are intended to be merely exemplary; numerous variations and modifications will be apparent to those skilled in the art. All such variations and modifications are intended to be within the scope of the present invention as defined in any appended claims.

Although the above discussion discloses various exemplary embodiments of the invention, it should be apparent that those skilled in the art can make various modifications that will achieve some of the advantages of the invention without departing from the true scope of the invention.

What is claimed is:

1. A microphone module comprising:
    a substrate having a first side, and a second side opposite the first side, the substrate having an aperture extending from the first side to the second side to allow sound waves to pass through the substrate;
    a lid directly contacting the first side, the first side and the lid defining a first interior volume;
    a microphone mounted to the first side and within the first interior volume;
    a housing coupled to the second side and covering the aperture, the housing having a top and at least one sidewall, the housing and second side forming a second interior volume, the housing including an acoustic port, the acoustic port being disposed through the top of the housing and configured to allow sound to enter the second interior volume;
    a pipe extending from an outside surface of the housing, the pipe having an open end to receive sound waves and direct them to an inside of the housing; and
    at least one exterior interface pad on the second side and outside of the second interior volume, the at least one exterior interface pad electrically coupled to the microphone.

2. The microphone module as defined by claim 1 wherein the pipe is straight.

3. The microphone module as defined by claim 1 wherein the pipe is straight.

4. The microphone module as defined by claim 1 wherein the housing has a top wall and at least one sidewall, the acoustic port being disposed through the sidewall of the housing, the pipe extending from the at least one sidewall of the housing.

5. The microphone module as defined by claim 1 wherein the microphone comprises a microelectromechanical systems (MEMS) microphone.

6. The microphone module as defined by claim 5 further comprising a circuit chip coupled with the first side of the substrate.

7. The microphone module as defined by claim 6 wherein the lid comprises conductive material, the lid being electrically connected with the substrate.

8. The microphone module as defined by claim 1 wherein the housing comprises a flanged sound pipe, the flanged sound pipe having a pipe volume, the pipe volume forming most of the second interior volume, the flanged sound pipe being mounted substantially flush against the second side of the substrate.

9. The microphone module as defined by claim 1 wherein the housing comprises a conductive material.

10. The microphone module as defined by claim 1 wherein the housing comprises a second acoustic port and a second pipe extending from the second acoustic port.

11. The microphone module as defined by claim 1 wherein the at least one exterior interface pad is surface mountable.

12. The microphone module as defined by claim 1 wherein the substrate comprises a laminate.

13. The microphone module as defined by claim 1 wherein the microphone covers the aperture in the substrate.

14. The microphone module as defined by claim 1 wherein the housing covers no more than a portion of the second side of the substrate.

15. A microphone module comprising:
    a substrate having a first side, and a second side opposite the first side, the substrate having an aperture extending from the first side to the second side to allow sound waves to pass through the substrate, the substrate having a metalized portion;
    a lid directly contacting the first side, the first side and lid defining a first interior volume, the lid being formed from a conductive material, the lid being electrically connected to the metalized portion of the substrate to protect against electromagnetic interference;
    a microphone mounted to the first side and within the first interior volume, the microphone being a microelectromechanical systems (MEMS) microphone;
    a circuit chip coupled with the first side of the substrate and being electrically connected with the microphone, the circuit chip being mounted within the first interior volume;
    a housing coupled to the second side and covering the aperture, the housing having a top and at least one sidewall, the housing and second side forming a second interior volume, the housing including an acoustic port disposed through the top of the housing and configured to allow sound to enter the second interior volume, the housing covering no more than a portion of the second side of the substrate;
    a pipe extending from an outside surface of the housing, the pipe having an open end to receive sound waves and direct them to an inside of the housing; and
    at least one exterior interface pad on the second side and outside of the second interior volume, the at least one exterior interface pad electrically coupled to the microphone, the at least one exterior interface pad being solderable.

16. The microphone module as defined by claim 15 wherein the pipe is straight.

17. A microphone module comprising:
    a substrate having an aperture to allow sound waves to pass through the substrate;
    a lid directly contacting the substrate, the lid and substrate defining a first interior volume;
    a microphone mounted to the substrate within the first interior volume;
    a housing coupled to the substrate and covering the aperture, the housing having a top and at least one sidewall and formed from a conductive material, the housing forming a second interior volume, the housing including an acoustic port being disposed through the top of the housing and configured to allow sound to enter the second interior volume;
    a pipe extending from an outside surface of the housing, the pipe having an open end to receive sound waves and direct them to an inside of the housing; and
    at least one exterior interface pad outside of the second interior volume, the at least one exterior interface pad electrically coupled to the microphone.

* * * * *